United States Patent [19]
Maue et al.

[11] Patent Number: 5,764,010
[45] Date of Patent: Jun. 9, 1998

[54] CONTROL SYSTEM FOR AN AUTOMOTIVE VEHICLE MULTI-FUNCTIONAL APPARATUS

[75] Inventors: H. Wilson Maue; Shawn P. Slusser, both of Farmington Hills; Jeffrey L. Kulczycki, Plymouth; Ronald Zaleski, Huntington Woods, all of Mich.

[73] Assignee: United Technologies Automotive, Inc., Dearborn, Mich.

[21] Appl. No.: 431,149

[22] Filed: Apr. 28, 1995

[51] Int. Cl.$^6$ .................................................. H02P 1/04
[52] U.S. Cl. .......................... 318/443; 318/445; 318/446; 15/250.16; 307/10.8
[58] Field of Search ........................ 318/443, 445, 318/444, 466–468, DIG. 2, 470; 15/250.16, 250.17; 307/10.8, 10.1, 9.1

[56] References Cited

U.S. PATENT DOCUMENTS

| | | |
|---|---|---|
| 2,659,237 | 11/1953 | Wood . |
| 3,421,380 | 1/1969 | Mansour . |
| 3,442,146 | 5/1969 | Simpson . |
| 3,443,442 | 5/1969 | Schweihs . |
| 3,443,455 | 5/1969 | Zugel . |
| 3,665,772 | 5/1972 | Beard et al. . |
| 3,689,817 | 9/1972 | Elliott . |
| 3,689,887 | 9/1972 | La Falce et al. . |
| 3,694,723 | 9/1972 | Schneider et al. . |
| 3,864,578 | 2/1975 | Lackey . |
| 3,917,330 | 11/1975 | Quantz . |
| 3,924,120 | 12/1975 | Cox, III . |
| 3,924,240 | 12/1975 | Given . |
| 4,009,952 | 3/1977 | Badalich et al. . |
| 4,085,403 | 4/1978 | Meier et al. . |
| 4,139,737 | 2/1979 | Shimada et al. . |
| 4,143,368 | 3/1979 | Route et al. . |
| 4,155,075 | 5/1979 | Weckenmann et al. . |
| 4,158,159 | 6/1979 | Orris et al. . |
| 4,160,238 | 7/1979 | Weckenmann et al. . |
| 4,164,730 | 8/1979 | Weckenmann et al. . |
| 4,227,588 | 10/1980 | Biancardi . |
| 4,259,624 | 3/1981 | Seibicke . |
| 4,270,205 | 5/1981 | DeShon . |
| 4,271,381 | 6/1981 | Munz et al. . |
| 4,276,501 | 6/1981 | Fanz ................................ 318/470 X |
| 4,290,134 | 9/1981 | Hampshire . |
| 4,293,947 | 10/1981 | Brittain . |
| 4,306,218 | 12/1981 | Leconte et al. . |

(List continued on next page.)

FOREIGN PATENT DOCUMENTS

| | | |
|---|---|---|
| 0 604 290 A1 | 6/1994 | European Pat. Off. . |
| 39 23 688 A1 | 1/1991 | Germany . |
| 2 047 919 | 12/1980 | United Kingdom . |
| WO 93/25412 | 12/1993 | WIPO . |

OTHER PUBLICATIONS

"Goodheart–Wilcox Automotive Encyclopedia", William K. Toboldt, Larry Johnson, Steven W. Olive, 1989, pp. 723–726.

"Automotive Handbook", Bosch 3rd Edition, 1993, pp. 694–697.

"Saab Owners Workshop Manual", Haynes Publishing Group 1981, 1986, pp. 172–174, 237.

(List continued on next page.)

*Primary Examiner*—Karen Masih
*Attorney, Agent, or Firm*—Harness, Dickey & Pierce, P.L.C.

[57] ABSTRACT

A control system for an automotive vehicle multi-functional apparatus employs an electronic control unit operably controlling a rear window wiper assembly. In another aspect of the present invention, an electronic control unit is operable as a multiplexed rear node for controlling a variety of liftgate devices and functions. In a further aspect of the present invention, an electronic control unit controls a single multi-functional electromagnetic device. The multi-functional electromagnetic device uses intermittent motion mechanisms to selectively operate differing devices driven therefrom. A method of operating the electronic control unit of the present invention is also provided.

44 Claims, 31 Drawing Sheets

U.S. PATENT DOCUMENTS

| | | |
|---|---|---|
| 4,307,301 | 12/1981 | Speidel . |
| 4,309,646 | 1/1982 | Liedtke et al. . |
| 4,336,482 | 6/1982 | Goertler et al. . |
| 4,352,299 | 10/1982 | Riggs et al. . |
| 4,355,385 | 10/1982 | Hampshire et al. . |
| 4,402,090 | 8/1983 | Gfeller et al. . |
| 4,410,983 | 10/1983 | Cope . |
| 4,422,522 | 12/1983 | Slavin et al. . |
| 4,435,648 | 3/1984 | Goode, III . |
| 4,435,704 | 3/1984 | Hashimoto et al. . |
| 4,481,585 | 11/1984 | Huntzinger et al. . |
| 4,492,904 | 1/1985 | Graham . |
| 4,528,662 | 7/1985 | Floyd et al. . |
| 4,532,432 | 7/1985 | Mizuno et al. . |
| 4,534,025 | 8/1985 | Floyd . |
| 4,538,262 | 8/1985 | Sinninger et al. . |
| 4,578,591 | 3/1986 | Floyd et al. . |
| 4,598,237 | 7/1986 | Wada et al. . |
| 4,614,903 | 9/1986 | Betsch et al. ............................ 318/443 |
| 4,616,224 | 10/1986 | Reighard . |
| 4,635,029 | 1/1987 | Yamada . |
| 4,639,065 | 1/1987 | Kohler et al. . |
| 4,701,629 | 10/1987 | Citroën ............................... 307/10.8 X |
| 4,733,147 | 3/1988 | Muller et al. . |
| 4,850,040 | 7/1989 | Teich et al. . |
| 4,878,398 | 11/1989 | Heinrich . |
| 4,885,512 | 12/1989 | Gille et al. . |
| 4,893,039 | 1/1990 | Isii . |
| 4,918,272 | 4/1990 | Nishikawa . |
| 4,930,049 | 5/1990 | Davenport et al. . |
| 5,023,530 | 6/1991 | Ohashi et al. . |
| 5,040,168 | 8/1991 | Maue et al. . |
| 5,063,317 | 11/1991 | Bruhn . |
| 5,182,957 | 2/1993 | Bohmer et al. . |
| 5,198,696 | 3/1993 | Dennis . |
| 5,218,255 | 6/1993 | Horiguchi . |
| 5,222,775 | 6/1993 | Kato . |
| 5,228,239 | 7/1993 | Heo . |
| 5,274,875 | 1/1994 | Chou . |
| 5,291,109 | 3/1994 | Peter . |
| 5,295,374 | 3/1994 | Bender et al. ...................... 307/10.8 X |
| 5,333,351 | 8/1994 | Sato . |
| 5,349,747 | 9/1994 | Dennis . |
| 5,355,061 | 10/1994 | Forhan . |
| 5,519,258 | 5/1996 | Stroven et al. . |

OTHER PUBLICATIONS

"McGraw–Hill Encyclopedia of Science & Technology", 6th Edition, 1987, p. 437.

"Kinematic Analysis of Mechanisms", 1959, J.E. Shigley, pp. 228–231.

"Genevamation Indexing Drives", Jan. 12, 1995 Catalog No. 693, Geneva Mechanisms Corporation.

Machine Design, "Basics of Design Engineering", Jun. 1992, Article Mechanical Systems.

A Paper from the Third Conference on Mechanisms, "A Survey of Intermittent–Motion", F.J. Bogardus, 1956, pp. 8–15.

Machine Design, Mechanisms for Intermittent Motion, Dec. 1951, Otto Lichtwitz, pp. 134–148.

"Mechanisms for Providing Intermittent Rotary Motion", Product Engineering, Aug. 1949, pp. 116–117.

Machine Design, "Mechanisms for Intermittent Motion, Part 2", Jan. 1952, Otto Lichtwitz, pp. 127–141.

Machine Design, "Mechanisms for Intermittent Motion, Part 3", Feb. 1952, Otto Lichtwitz, pp. 146–155.

Machine Design, "Mechanisms for Intermittent Motion, Part 4, ", Mar. 1952, Otto Lichtwitz, 145–155.

A Paper from the Third Conference on Mechanisms, "Designing for Intermittent Motion with Modified Star-wheels", Karl E. Kist, pp. 16–20.

"Mechanisms for Engineering Design" Motion, Circular, Intermittent, Chapter 3, S. B. Tuttle, John Wiley Co., pp. 33–51.

Machine Design, "Modifying Starwheel Mechanisms", Vandeman and wood, apr. 1952, pp. 255–261.

"Kinematics of Intermittent Mechanism III —The Sperhical Geneva Wheel", Product Engineering, Oct. 1949, S. Rappaport, pp. 137–139.

Machine Design, "Mechanical Systems", Jun. 1992.

"Mechanisms and Dynamics of Machinery", Hamilton H. Mabie and Fred W. Ocvirk, John Wiley & sons, 1957.

"Chilton's Wiring Diagrams Manual 1991 Domestic Cars", Chilton Professional Book Co., 1993.

"Electronics Engineers' Handbook", Third Edition, 1989, pp. 16–49 –16–53.

"Saab Owners Workshop Manual", Haynes Publishing Group, 1981, 1986, pp.265–289.

"SAE Recommended Practice J1850 Class B Data Communication Network Interface", Jul. 1, 1993, Entire Book.

"68HC05V7 Specification Rev. 1.0 (General Release)", Aug. 12, 1994, Entire Book.

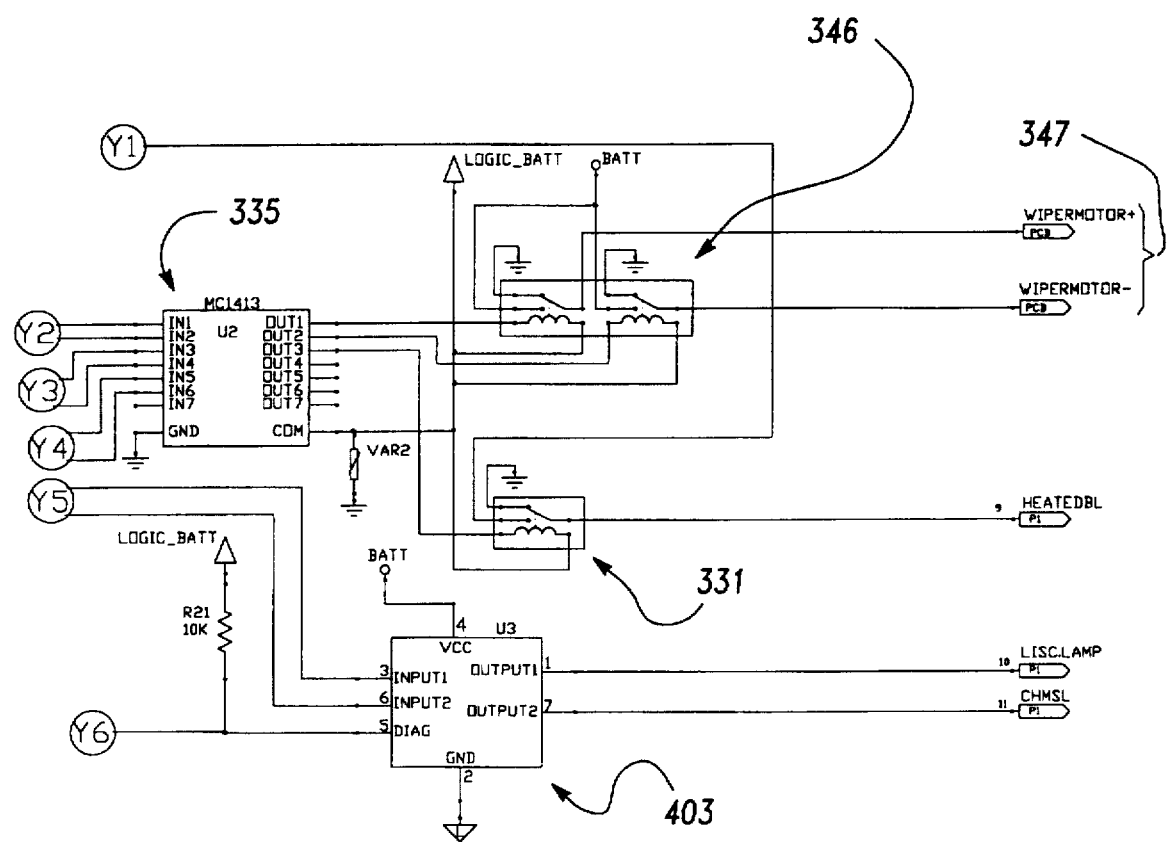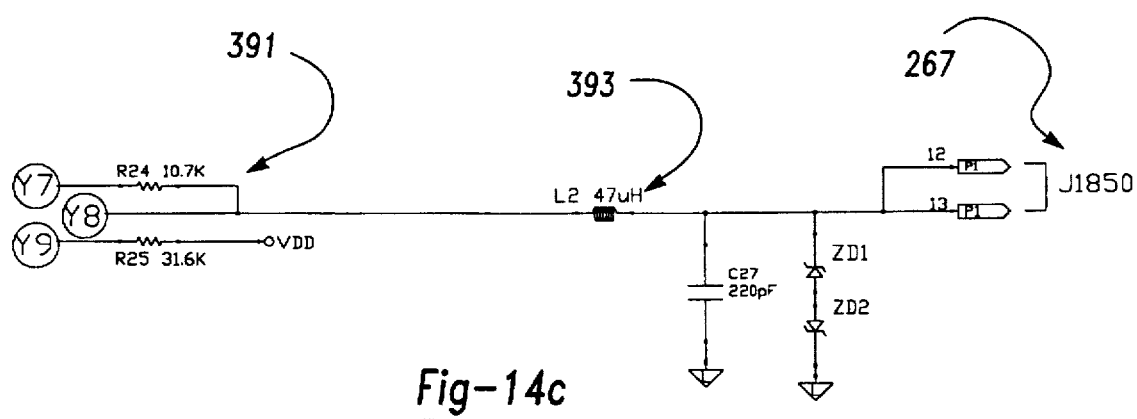
Fig-14c

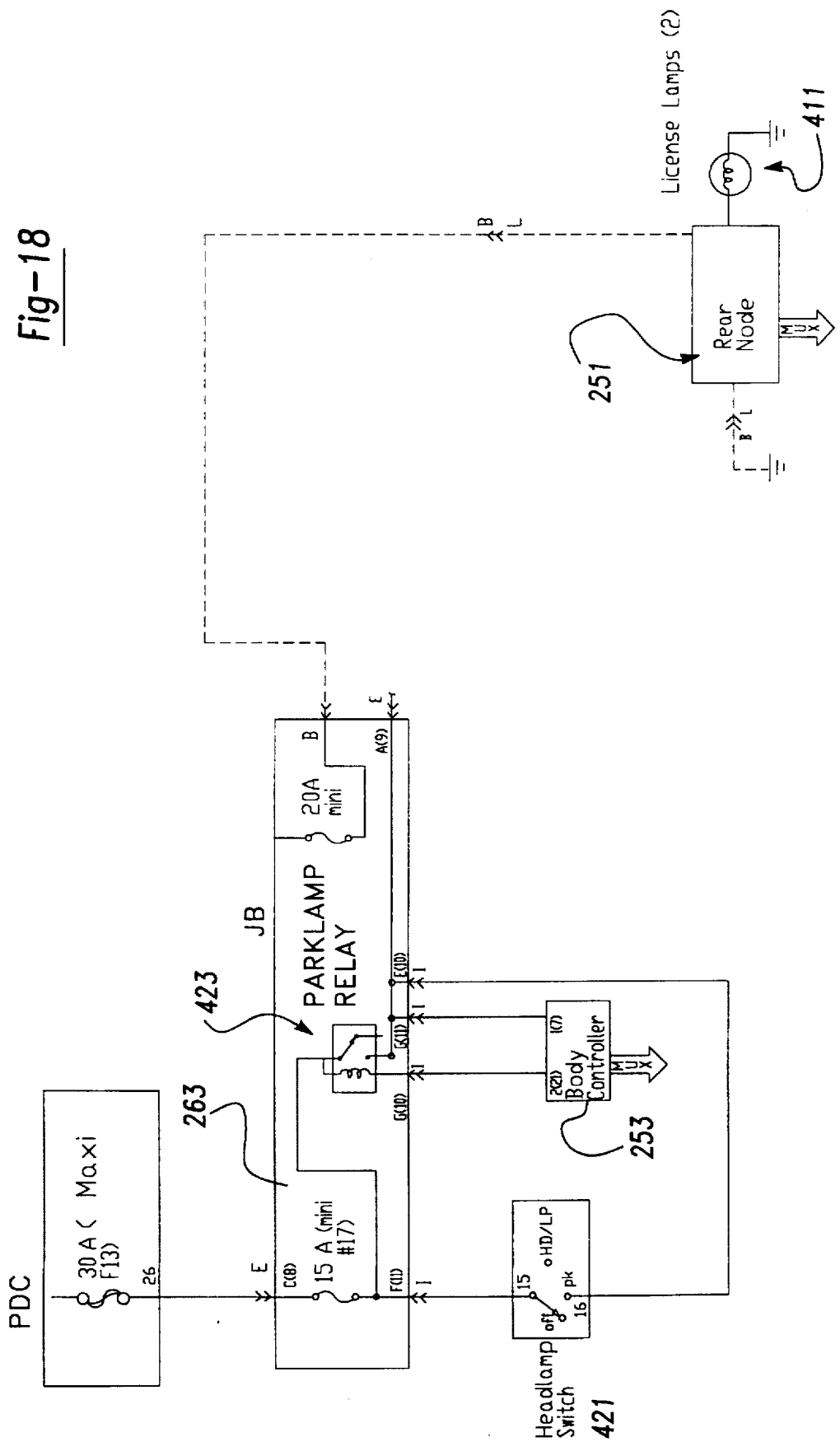

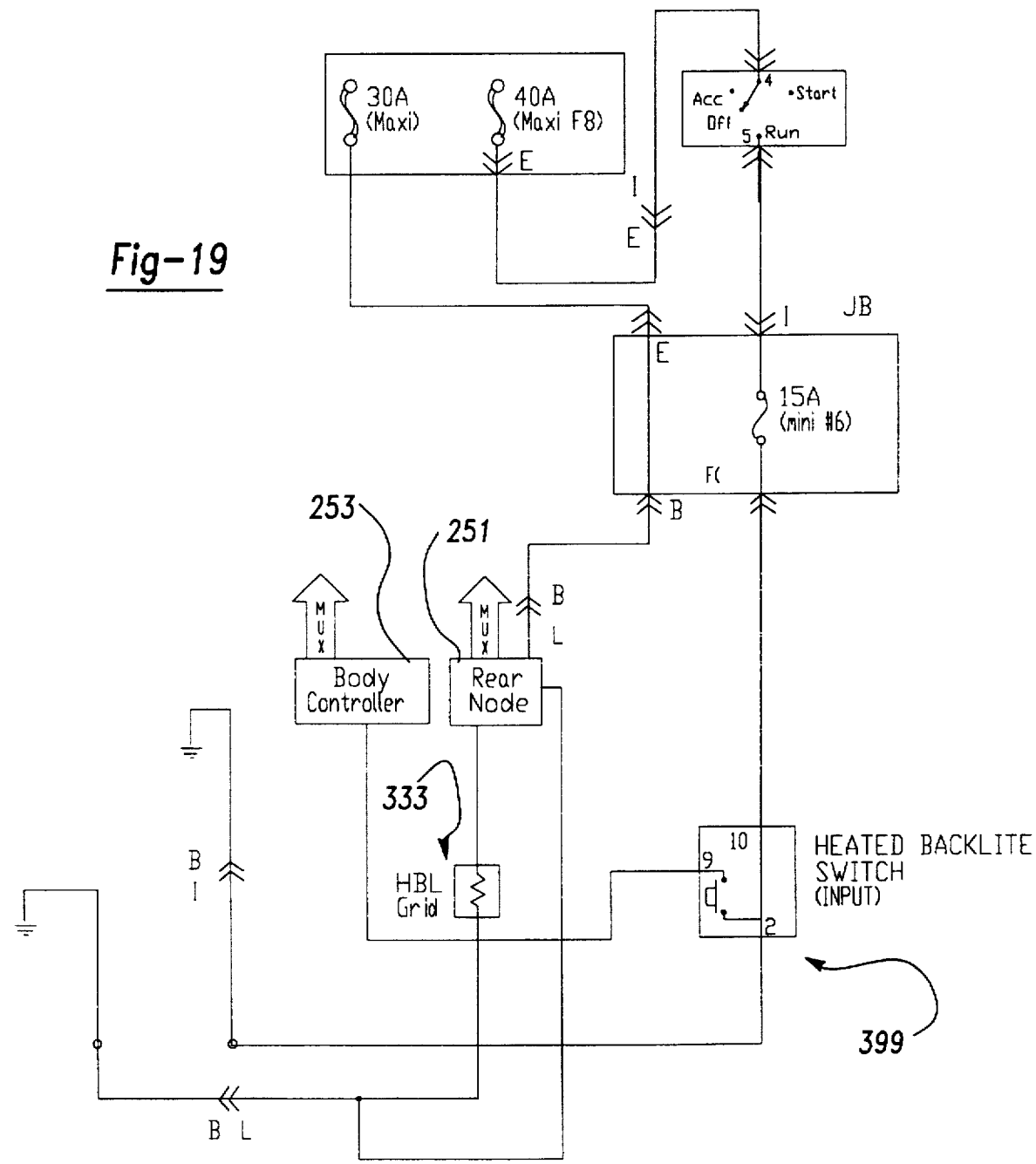

CONTROL SYSTEM FOR AN AUTOMOTIVE VEHICLE MULTI-FUNCTIONAL APPARATUS

CROSS REFERENCE TO RELATED APPLICATIONS

This application relates to the following simultaneously filed patent applications, which are incorporated by reference herewithin: U.S. application Ser. No. 08/431,148 entitled "Multi-Functional Apparatus Employing An Electromagnetic Device" by H. Winston Maue and Eric J. Krupp; and U.S. application Ser. No. 08/430,388 entitled "Multi-Functional Apparatus Employing an Intermittent Motion Mechanism" by William C. Zimmer and James Wayne Gibson.

BACKGROUND OF THE INVENTION

This invention relates generally to control systems for automobiles and specifically to a multiplexed control system for an automotive vehicle multi-functional apparatus.

Almost all automotive vehicles have a single or a pair of windshield wiper assemblies. These assemblies traditionally include rubber wiper blades mounted upon claw brackets. These claw brackets are pivotably attached to wiper arms mounted upon rotating shafts. These shafts are either directly driven by electric motors or driven by a single electric motor which actuates series or parallel-coupled four-bar linkage mechanisms. It is further known to provide a wiper system, in combination with a wash device, to clean headlamps for automotive vehicles.

It is also common to employ a window wiper assembly for cleaning rear windows of automotive vehicles. Typically, these types of rear window wiper assemblies include a wiper blade mounted upon a bracket which is coupled to a wiper arm. The wiper arm is attached to a wiper shaft rotatably driven in a cyclical oscillating manner by a helical gear. A reversible, fractional horsepower, dc electric motor serves to actuate the helical gear through an armature shaft-mounted worm gear enmeshed therewith. This type of rear window wiper arrangement is usually mounted upon a pivoting liftgate of a minivan, station wagon, sport-utility vehicle or the like. Examples of conventional window wiper assemblies and motor mechanisms are disclosed with the following U.S. Pat. Nos.: 4,893,039 entitled "Windshield Wiper Motor" which issued to Isii on Jan. 9, 1990; 4,878,398 entitled "Driving Device for Window Wiper of Motor Vehicles" which issued to Heinrich on Nov. 7, 1989; 4,336, 482 entitled "Rear Window Wiper Motor Control" which issued to Goertler et al. on Jun. 22, 1982; 4,259,624 entitled "Arrangement for Wiping a Vehicle Window" which issued to Seibicke on Mar. 31, 1981; 3,694,723 entitled "Motor Vehicle Windshield Wiper Having a Parking Position Outside the Wiper Area" which issued to Schneider et al. on Sep. 26, 1972; and, 3,665,772 entitled "Windshield Wiper Motor Link Depressed Park Mechanism" which issued to Beard et al. on May 30, 1972. All of these patents are incorporated by reference herewithin.

Some conventional vehicles also provide a rear window release lock or latch, actuated by a solenoid, which can be unlocked to allow for upward pivotal movement of the rear window in relation to the otherwise stationary liftgate. In combination therewith, a separate liftgate lock is often mounted upon the liftgate door for fastening the liftgate to the body to prevent inadvertent pivotal opening. This liftgate lock is traditionally operated by manual key or handle rotation, or through a separate electric motor or solenoid.

Additionally, separate motors and solenoids are required to actuate passenger door locks, an antenna retraction mechanism, headlamp cover retraction mechanisms, a fuel filler door lock and other similar functions. The traditional need for such a multiplicity of electromagnetic devices has increased the automotive vehicle weight and cost while further proving difficult to package within the often small spaces provided. This added weight is especially detrimental when the window wiper mechanism, rear window lock and liftgate lock, as well as their distinct respective electromagnetic devices, are all incorporated within the pivoting liftgate. Not only is the piece cost increased due to this multiplicity of electromagnetic devices, but the assembly cost, part number proliferation and handling costs, electrical wiring costs, objectional motor noise, and failure modes are increased.

It is also known to provide multiplexed circuitry within automotive vehicles. Examples of such multiplexed systems are disclosed within the following U.S. Pat. Nos: 4,578,591 entitled "Control Circuit for Automotive Accessory System" which issued to Floyd et al. on Mar. 25, 1986; 4,534,025 entitled "Vehicle Multiplex System Having Protocol/Format for Secure Communication Transactions" which also issued to Floyd on Aug. 6, 1985; 4,528,662 entitled "Multiplex Control System Having Enhanced Integrity" which also issued Floyd et al. on Jul. 9, 1985; 4,492,904 entitled "Windshield Wiper System With Touch Control" which issued to Graham on Jan. 8, 1985; 4,355,385 entitled "Multiplex Information Handling System" which issued to Hampshire et al. on Oct. 19, 1982; and 4,293,947 entitled "Information Handling System" which issued to Brittain on Oct. 6, 1981; all of which are incorporated by reference herewithin. While various of these patents having significantly improved the art, multiplexed circuits, in general, have not proven to be cost effect in automotive vehicle applications due to the often limited number of operable components and functions integrated into a multiplexed node. The incremental increase in microprocessor costs are rarely offset by the reduction in wiring costs. For instance, discretely wired, non-multiplexed wiring harnesses have always been used to electrically connect liftgate devices to the body wire harness. These conventional wire harnesses are costly, cumbersome to package, difficult and heavy for handling and installation, and inhibit easy pivoting of the liftgate door due to the wire harness stiffness. Expensive and large electrical connectors are also required.

SUMMARY OF THE INVENTION

In accordance with the present invention, the preferred embodiment of a control system for an automotive vehicle multi-functional apparatus employs an electronic control unit operably controlling a rear window wiper assembly. In another aspect of the present invention, an electronic control unit is operable as a multiplexed rear node for controlling a variety of liftgate devices and functions. In a further aspect of the present invention, an electronic control unit controls a single multi-functional electromagnetic device. The multi-functional electromagnetic device uses intermittent motion mechanisms to selectively operate differing devices driven therefrom. A method of operating the electronic control unit of the present invention is also provided.

The control system of the present invention is advantageous over conventional systems since the present invention combines many different functions into a single electronic control unit. Furthermore, the electronic control unit is programmable thereby allowing for relatively easy modifications and vehicle-to-vehicle and customer selected option differences without hardware changes. Moreover, a single electromagnetic device is controlled by the control system thereby further enhancing the synergistic effects of the present invention. For example, the electronic control unit replaces the traditional separate rear wiper motor, liftgate lock motor and rear window lock solenoid. Since an electronic control unit is required to operate the single electromagnetic device, it is cost effective to also use this electronic control unit as a multiplexed rear node. Accordingly, the present invention significantly reduces the piece cost, assembly cost, part proliferation and handling costs, and wiring costs as compared to non-multiplexed and multiple electromagnetic device constructions. Furthermore, the control system and multi-functional apparatus of the present invention significantly reduces weight and packaging space requirements while increasing the electrical and mechanical reliability of the affected systems. For instance, by multiplexing the present invention circuits, 14 conventional circuits and 8 conventional takeouts (i.e., splices or connections) can be deleted. Additional advantages and features of the present invention will become apparent from the following description and appended claims, taken in conjunction with the accompanying drawings.

BRIEF DESCRIPTION OF THE DRAWINGS

FIGS. 14a–c are electrical schematic diagrams showing the preferred embodiment control system of the present invention;

FIG. 18 is an electrical schematic diagram showing a license lamp portion of the preferred embodiment control system of the present invention;

FIG. 19 is an electrical schematic diagram showing a heated backlite portion of the preferred embodiment control system of the present invention;

DETAILED DESCRIPTION OF THE PREFERRED EMBODIMENT

Figure 1:
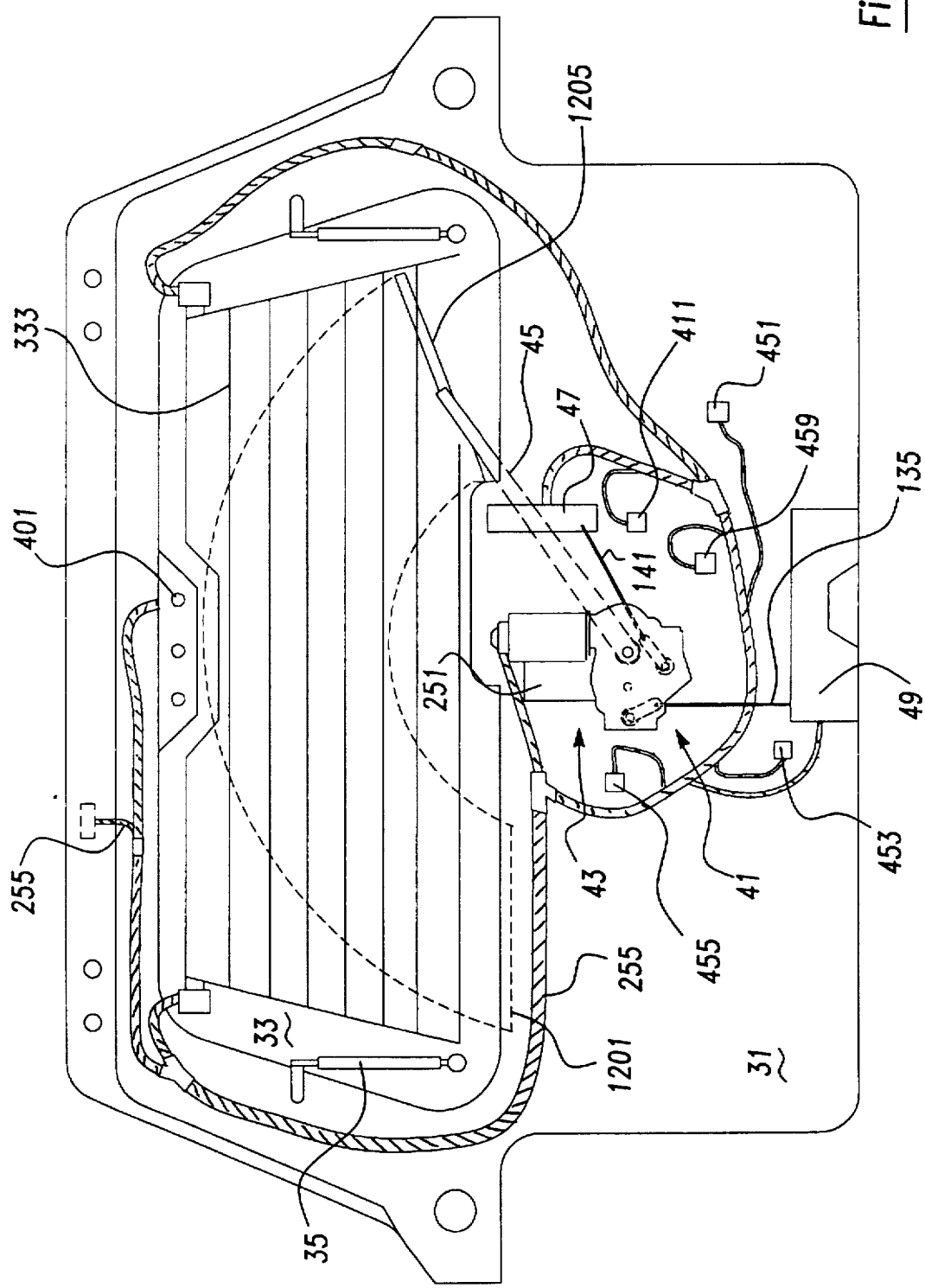
FIG. 1 is a front elevational view showing the preferred embodiment of a control system for an automotive vehicle multi-functional apparatus.

An automotive vehicle, such as a minivan or the like, has a rear liftgate door which can pivot about an upper pair of hinges coupled to the vehicle body structure. When the liftgate is pivoted to an open position, a cargo space is accessible from behind the vehicle. Such a liftgate is shown in FIG. 1. Liftgate 31 has a rear window or backlite 33 pivotable between a closed position, substantially flush with the outer surface of liftgate 31, to an open position about the upper hinges. A pair of pneumatic cylinders 35 act to push window 33 toward the open position when a lower portion of window 33 is released. A multi-functional apparatus 41 of the present invention is mounted upon an inner surface of liftgate 31 and is operated by the preferred embodiment of a control system of the present invention. The majority of apparatus 41 is hidden by an interior trim panel (not shown). Apparatus 41 includes a central drive and power transmission unit 43, a window wiper assembly 45, a window release latch or lock 47 and a liftgate lock 49, all of which are mounted upon liftgate 31. Examples of such locks (employing separate solenoids or motors, which would be removed in order to couple the lock mechanism for use with the present invention) are disclosed within the following U.S. Pat. Nos.: 5,222,775 entitled "Power Operated Latch Device for Automotive Back Door" which issued to Kato on Jun. 29, 1993; 4,422,522 entitled "Inertial Lock for Vehicle Door Latch" which issued to Slavin et al. on Dec. 27, 1983; and, 3,917,330 entitled "Electric Lock Release" which issued to Quantz on Nov. 4, 1975; all of which are incorporated by reference herewithin.

Figure 2:
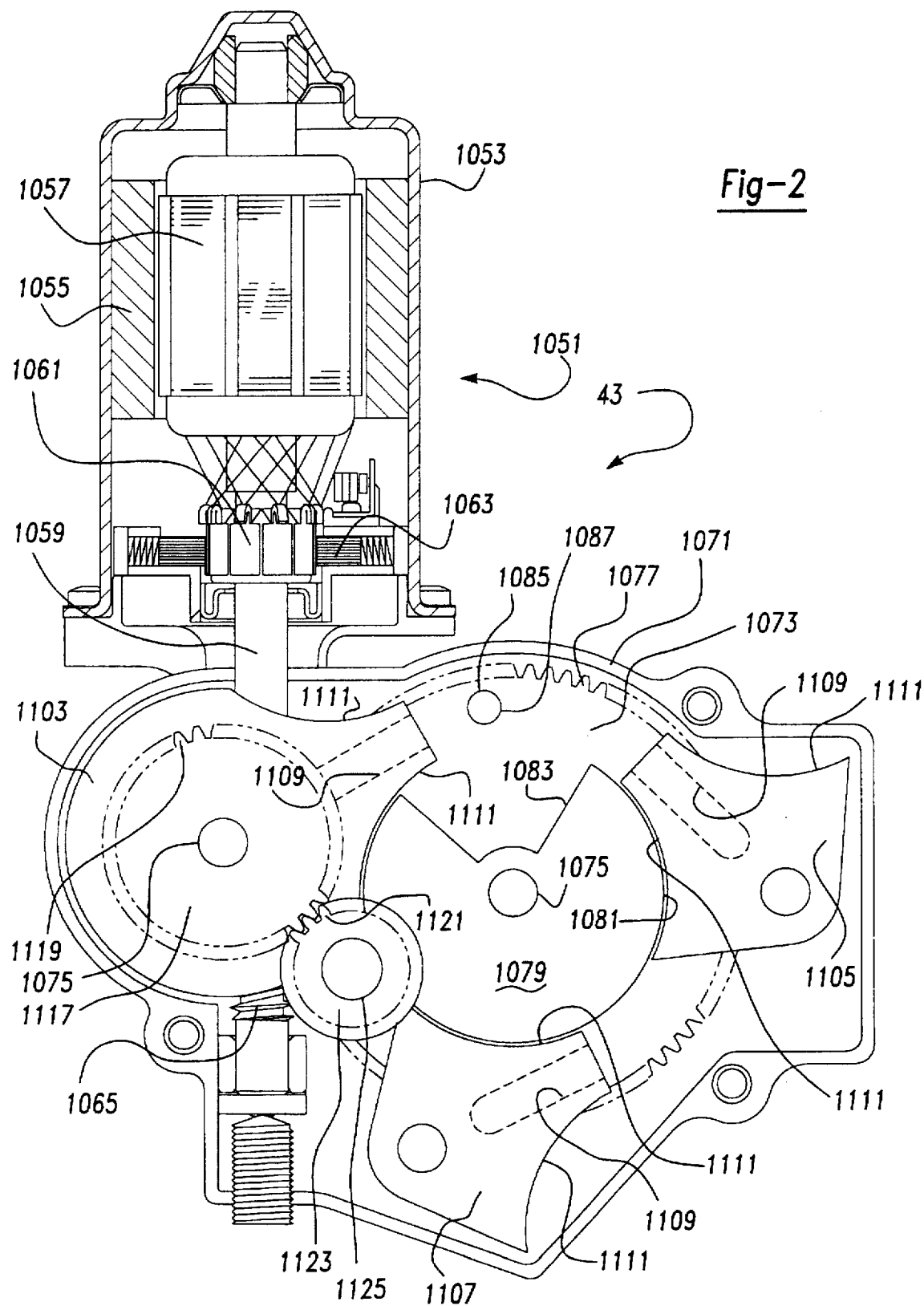
FIG. 2 is a rear elevational view, with portions broken away therefrom, showing a first preferred embodiment multi-functional apparatus employed in the preferred embodiment control system of the present invention.
Figure 3:
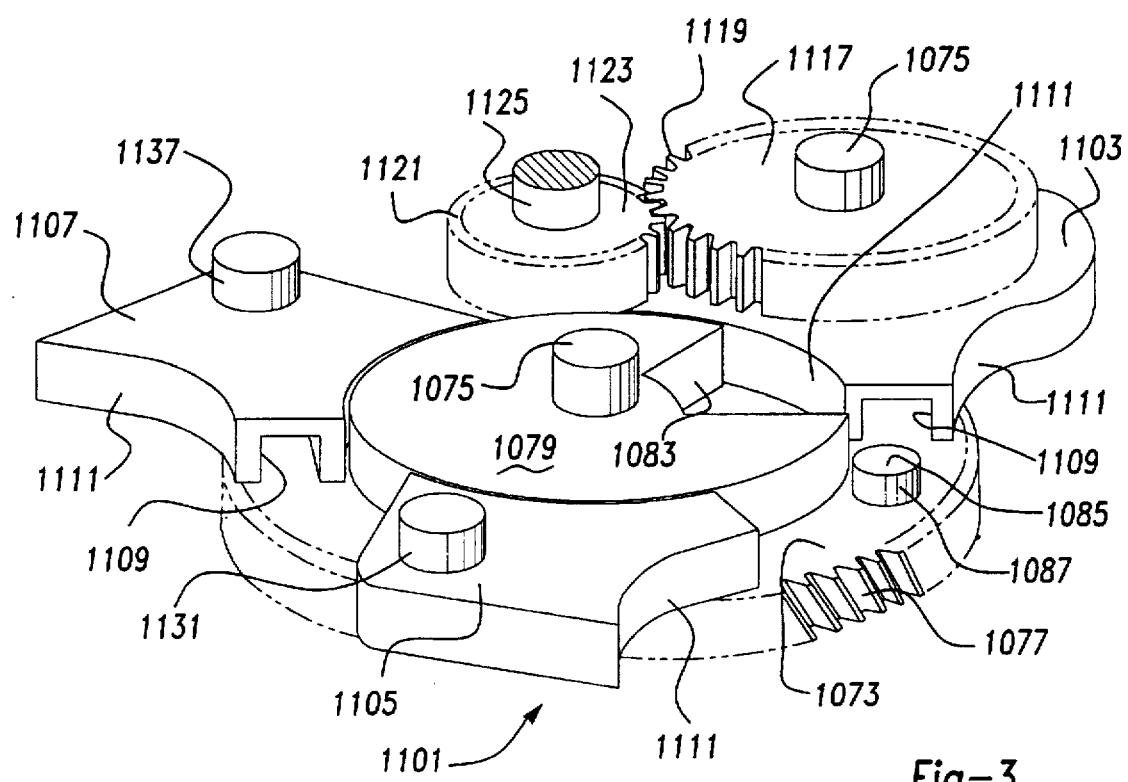
FIG. 3 is a perspective view showing a power transmission assembly employed in the first preferred embodiment control system of the present invention.
Figure 4:
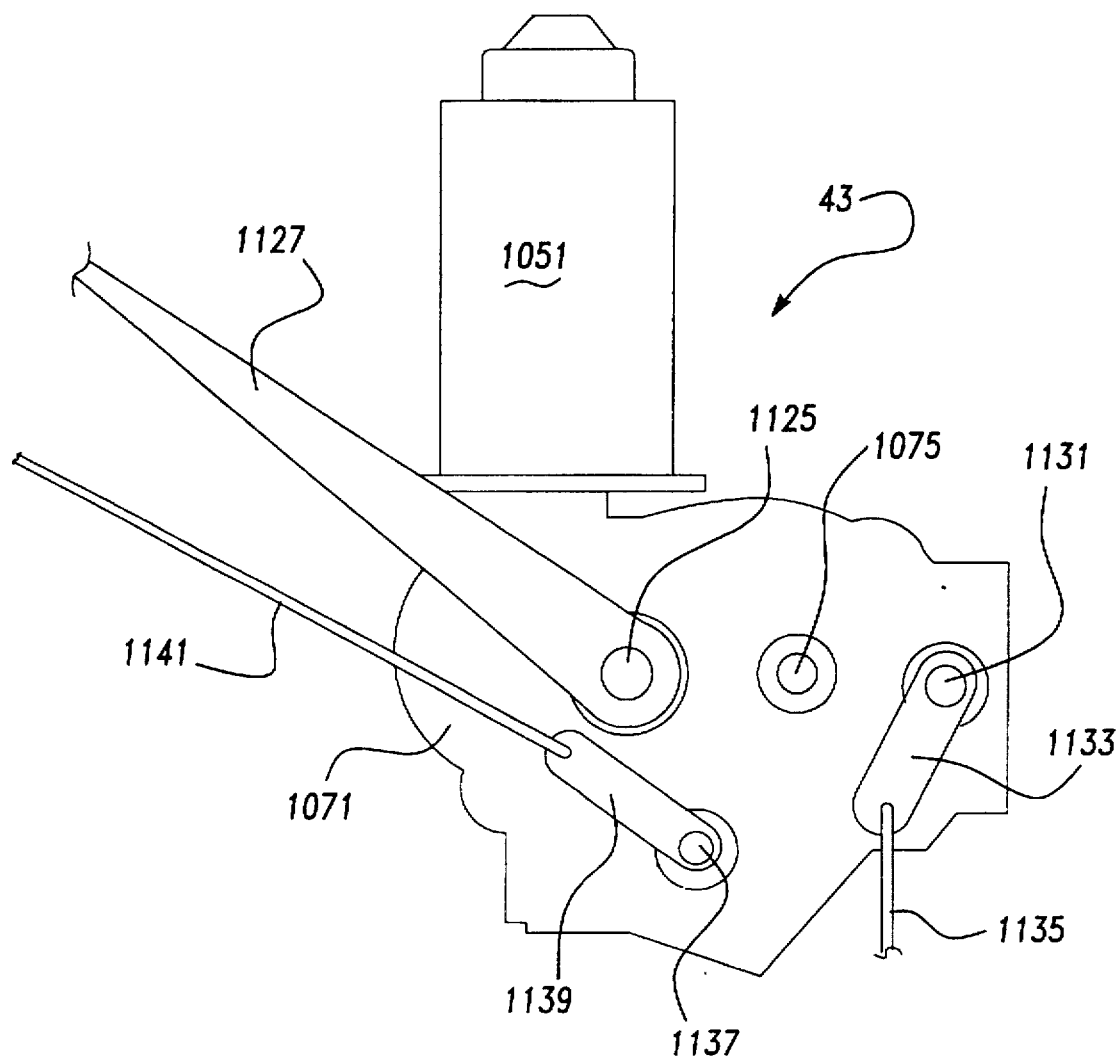
FIG. 4 is a fragmentary rear elevational view showing the first preferred embodiment control system apparatus of the present invention.

The construction of a first preferred embodiment of the central drive and power transmission unit 43 is best illustrated in FIGS. 2–4. An electric motor 1051 is of a conventional 12 volt fractional horsepower, dc electromagnetic variety having a metallic motor housing 1053 within which are stationary permanent magnets 1055, a rotatable armature 1057 with wire windings, a rotatable armature shaft 1059 joined to armature 1057, a commutator 1061 electrically connected to the wire windings and rotatable with armature shaft 1059, a brush card assembly 1063 and various electronic components, bushings and retainers. It will be appreciated to those skilled in the art that other electric motor constructions can readily be substituted for that shown. A worm gear segment 1065, known as a rotatable member, is provided upon a portion of armature shaft 1059 extending beyond motor housing 1053.

A gear housing 1071 is also provided for receiving worm gear segment 1065 and the immediately adjacent portions of armature shaft 1059. A main helical gear 1073, also known as a rotatable member, is also housed and rotatably journaled within gear housing 1071. Gear housing 1071 is preferably made from cast aluminum. A plurality of knurled steel journaling pins 1075 are press fit or otherwise attached within machined openings of gear housing 1071. The placement of these openings in relation to each other is important. Pins 1075 can alternately be molded as part of plastic gears and cams.

Helical gear 1073 has an external set of helically oriented teeth 1077 projecting entirely therearound for meshing with worm gear segment 1065. A drum 1079 is mounted upon a face of helical gear 1073 for rotating therewith. Drum 1079 has a partially circular peripheral surface 1081 interrupted by a clearance indentation 1083. Drum 1079 and helical gear 1073 are coaxially aligned for rotation about their respective journaling pin 1075. A drive pin 1085 projects from a face of helical gear 1073 substantially parallel to the adjacent journaling pin 1075. Drive pin 1085 has a cylindrical driving interface surface 1087 thereabout. Of course, a rotatable sleeve may alternately surround drive pin 1085. Other alternate driving interface means may be employed such as an integrally molded finger, screw, rivet, spring, rib, plural projections or other similar formations protruding from a face of peripheral portion of helical gear 1073. Helical gear 1073 is preferably injection molded from a polymeric material such as acetyl. An electrically conductive feedback disk 1089 (see FIG. 12) is retained to an inside face of helical gear 1073 through ultrasonically rolled welding or insert molding. Feedback disk 1089 is comprised of a set of copper alloy or brass alloy stamped contacts which are provided with differing conductive and nonconductive patterns depending on the specific positional ranges as will be discussed in greater detail hereinafter.

A power transmission assembly 1101 of central drive and power transmission unit 43 employs three intermittent rotary motion mechanisms or cams 1103, 1105 and 1107. Each cam has a single, linear, external open channel 1109 defined by driven interfacing surfaces or walls therein. Driving interface surface 1087 of drive pin 1085 is selectively engagable against the walls defining channels 1109 of each cam. Each cam is rotatable about its respective journaling pin 1075. Furthermore, partially circular external surfaces 1111 of each cam register with the partially circular peripheral surface 1081 of drum 1079. A relatively tight tolerance on these registering surfaces of about 1–2 thousandths of an inch is preferably used. Thus, unless each cam is aligned with indentation 1083 of drum 1079, partially circular peripheral surface 1081 of drum 1079 will act to prevent rotation of each cam. However, when indentation 1083 of drum 1079 aligns with an individual cam, concurrently with drive pin 1085 engaging within a channel 1109 of the same cam, continued rotation of helical gear 1073 will cause the selectively coupled cam to rotate therewith. Moreover, the selectively coupled cam will have increased rotational acceleration as drive pin 1085 moves closer to journaling pin 1075 within channel 1109. This rotational acceleration, then deceleration, achieves a desirable inertial ramping up and ramping down effect such that potentially harmful inertial stresses and cyclical fatigue within the device coupled thereto are avoided. The diameter of drive pin 1085 should match channel 1109 width within half a thousandth of an inch.

Cam 1103 additionally has a spur gear 1117 stacked coaxially thereupon for simultaneous movement therewith. Spur gear 1117 has a peripheral set of teeth 1119 extending entirely therearound for enmeshing with a mating external set of teeth 1121 extending entirely around a driven pinion gear 1123. Pinion gear 1123 rotates the output shaft. The window wiper shaft 1125 extends from a rear face of pinion gear 123 for moving in concert therewith. Wiper shaft 1125 is attached to pinion gear 123 through rivets, insert molding, knurled press fitting, et cetera. A window wiper arm 1127 of wiper assembly 45 is mounted upon wiper shaft 1125 in a conventional manner. Wiper shaft is preferably made from cold rolled steel. The system is designed to oscillate wiper assembly 45 at forty-five cycles per minute (round trip) but other cycle frequencies can be achieved.

A protuberance 1131 projects from a rear face of cam 1105 and engages with a lever 1133 which, in turn, is attached to a liftgate lock rod 1135. Protuberance 1131, lever 1133 and rod 1135 are also considered to be lock couplings or coupling members. Lock connecting rod 1135 is joined to liftgate lock 49 (see FIG. 1) for causing the mechanisms therein to move in response to movement of cam 1105. Similarly, a protuberance 1137 extends from and moves with a rear face of cam 1107. A lever 1139 is connected to protuberance 1137 for moving therewith. A liftgate window release lock connecting rod 1141 connects lever 1139 to liftgate window release lock 47 (see FIG. 1) for causing window releasing movement thereof in response to selective movement of cam 1107. Protuberance 1137, lever 1139 and connecting rod 1141 are also defined as liftgate window release lock couplings or coupling members. Protuberances 1131 and 1137 are preferably secured to their respective levers 1133 and 1139 in a keyholed manner. Additional threaded nuts, push nuts, crimpings, cotter pins and washers or the like (not shown) may be employed to retain the levers to their protrusions. The cams, spur gear and pinion gear are preferably made from powdered metallic steel. Alternately, other coupling means may be employed such as cables, belts, chains, gear sets, multiple linkages, jack screws, rack and pinion gear sets or the like.

Figure 5:
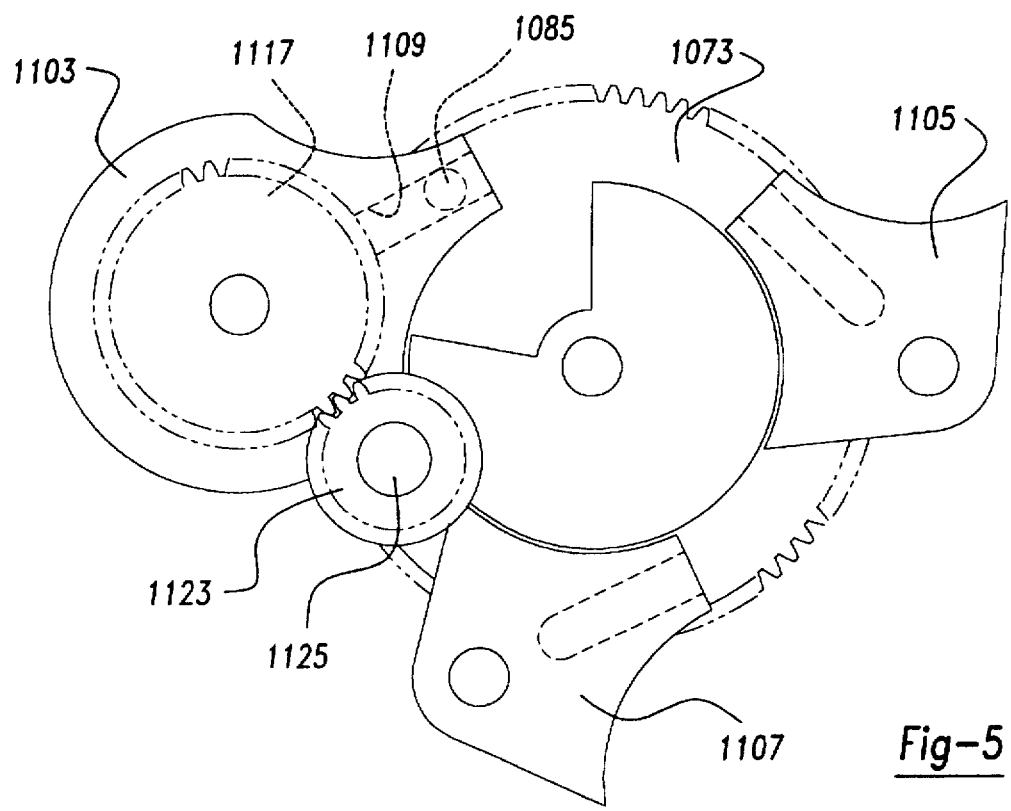
FIG. 5 is a diagrammatic rear view showing the power transmission assembly mechanisms of the first preferred embodiment control system of the present invention in the beginning of a wipe position.
Figure 6:
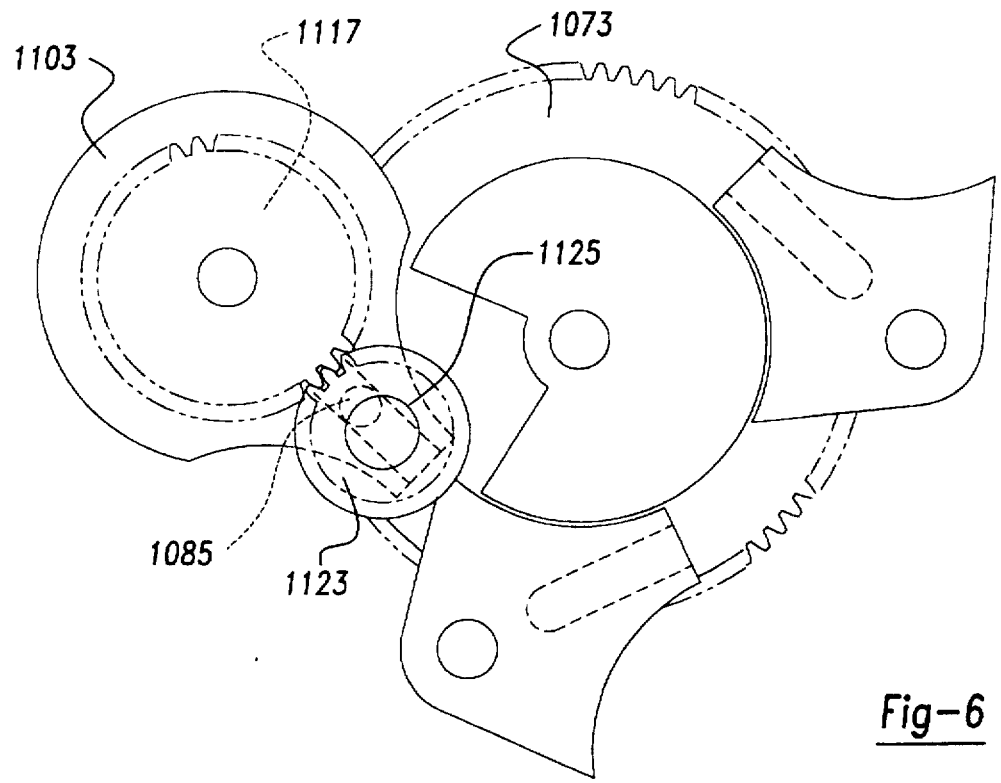
FIG. 6 is a diagrammatic rear view showing the power transmission assembly of the first preferred embodiment control system of the present invention at the end of one direction of a wiping motion.
Figure 7:
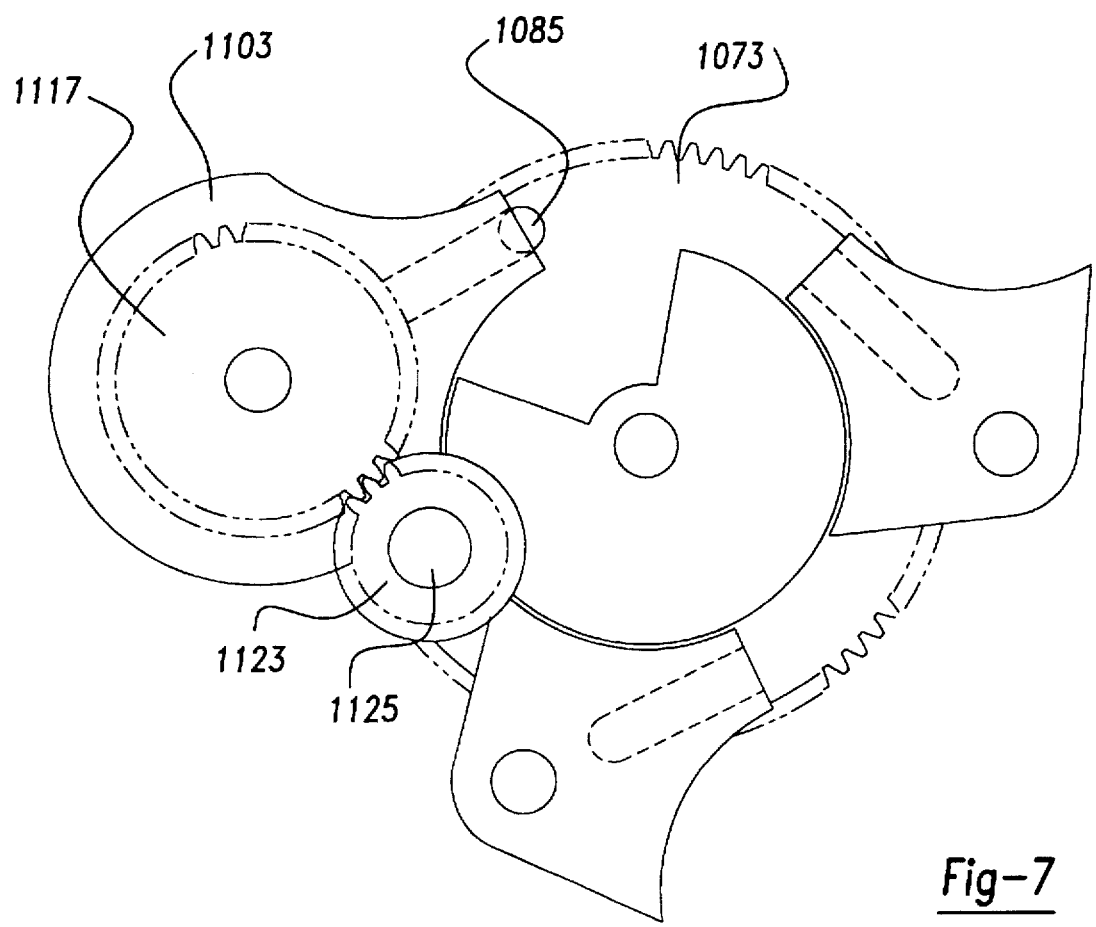
FIG. 7 is a diagrammatic rear view showing the power transmission assembly of the first preferred embodiment control system of the present invention at the end of the depressed park position.

The operation of the multi-functional apparatus of the present invention can best be understood by referring to FIGS. 5–12. In FIG. 5, drive pin 1085 has partially entered channel 1109 of cam 1103. In this position, the wiper blade is moved 6° from a depressed park position 1201 (see FIGS. 1 and 12) to the beginning of the window wipe range designated as position 1203 (see FIG. 12). FIG. 6 shows helical gear 1073, drive pin 1085, cam 1103, spur gear 1117 and pinion gear 1123 rotated 162° to the completion position 1205 (see FIGS. 1 and 12) at the end of the window wipe range. The electrical polarity is then reversed to motor 1051 (see FIG. 2) such that rotation of helical gear 1073, drive pin 1085, cam 1103, spur gear 1117, pinion gear 1123 and wiper shaft 1125 are reversed back to helical gear position 1203 (see FIG. 12). Referring to FIG. 7, helical gear 1073 is rotated such that drive pin 1085 moves cam 1103, spur gear 1117, pinion gear 1123, wiper shaft 1125 and wiper assembly 45 to the depressed wiper arm parking position 1201 (see FIGS. 1 and 12). The wiper blade is thus moved off of the rear liftgate window such that the wiper blade is supported on a bracket upon the liftgate door. This allows for free, noninterfered movement of the lift glass window.

Figure 8:
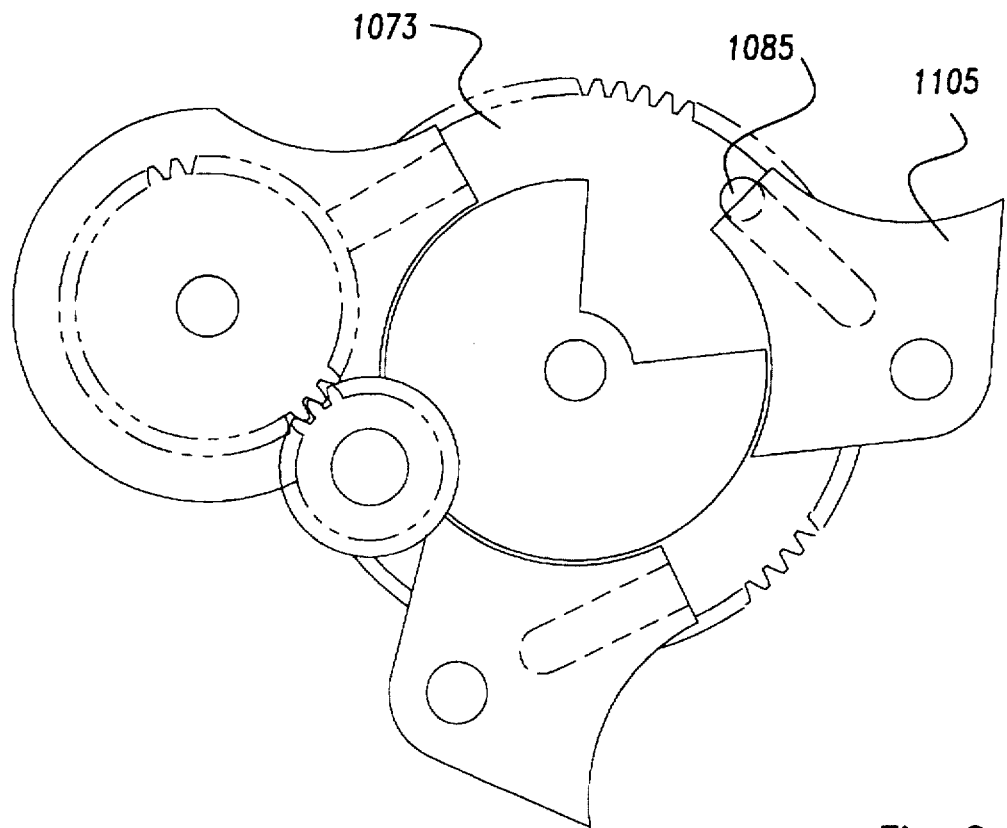
FIG. 8 is a diagrammatic rear view showing the power transmission assembly of the first preferred embodiment control system of the present invention at the beginning of a liftgate unlocking motion.
Figure 9:
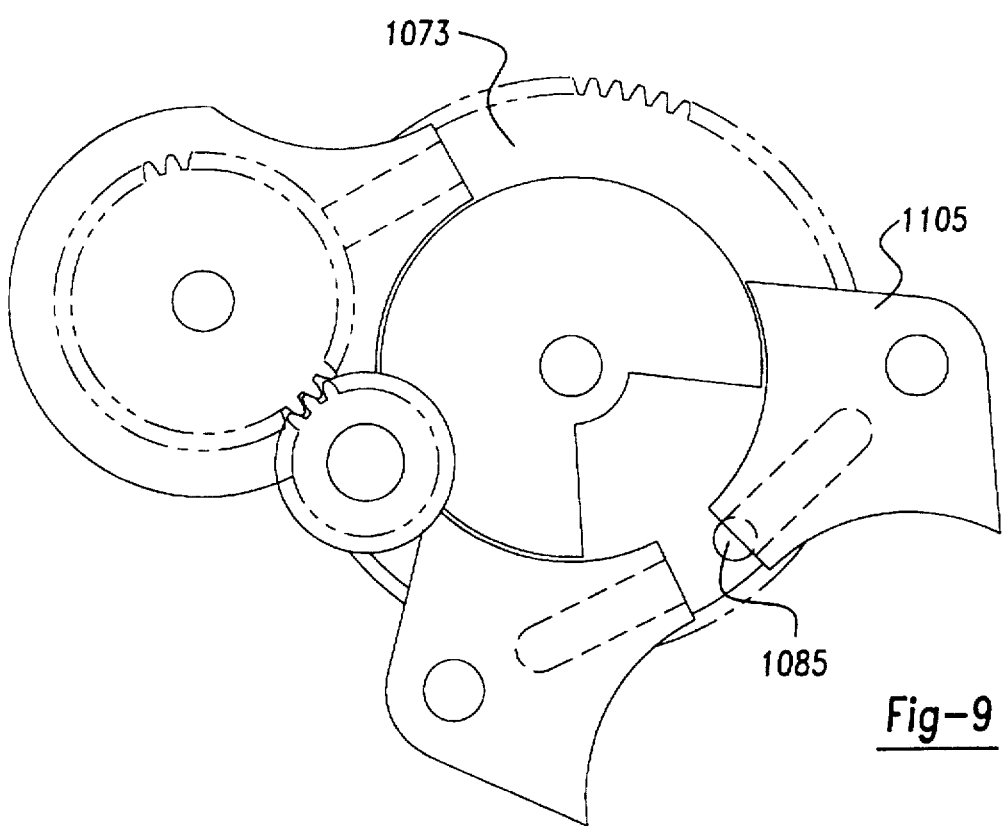
FIG. 9 is a diagrammatic rear view showing the power transmission assembly of the first preferred embodiment control system of the present invention at the completion of the liftgate unlocking motion.
Figure 12:
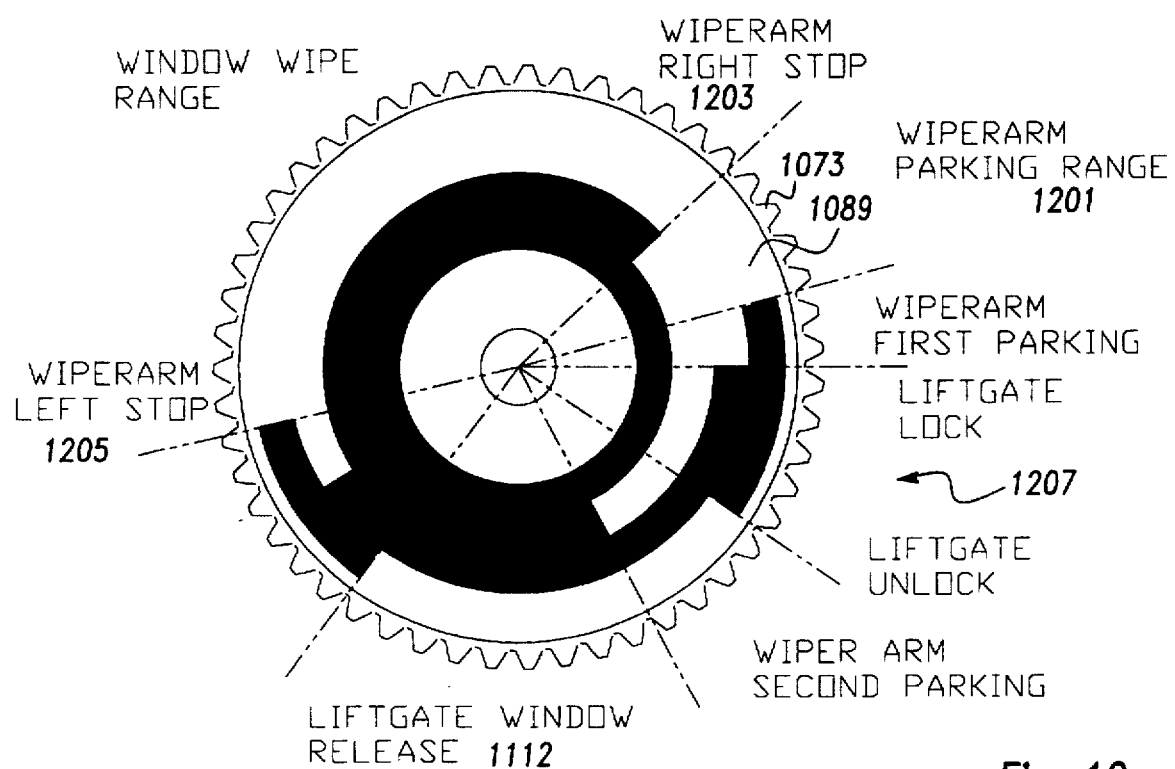
FIG. 12 is a diagrammatic front view showing a motor feedback circuit disk employed in the first preferred embodiment control system of the present invention.

FIG. 8 illustrates helical gear 1073 and drive pin 1085 moved to the beginning of a liftgate lock/unlock positional range 1207 (see FIG. 12). Subsequently, FIG. 9 shows helical gear 1073 and drive pin 1085 rotated to the completion of the liftgate lock/unlock positional range 1207. Clockwise movement (as illustrated) of helical gear 1073 through range 1207 causes cam 1105 to move to an unlocked orientation thereby causing the couplings and liftgate lock 49 (see FIG. 1) associated therewith to also be moved from a locked orientation to an unlocked orientation. Motor 1051 (see FIG. 2) can then be reversed to move helical gear 1073 in a counterclockwise direction (as illustrated); this causes drive pin 1085, cam 1105, the couplings and liftgate lock 49 (see FIG. 1) to move from an unlocked orientation to a locked orientation.

Figure 10:
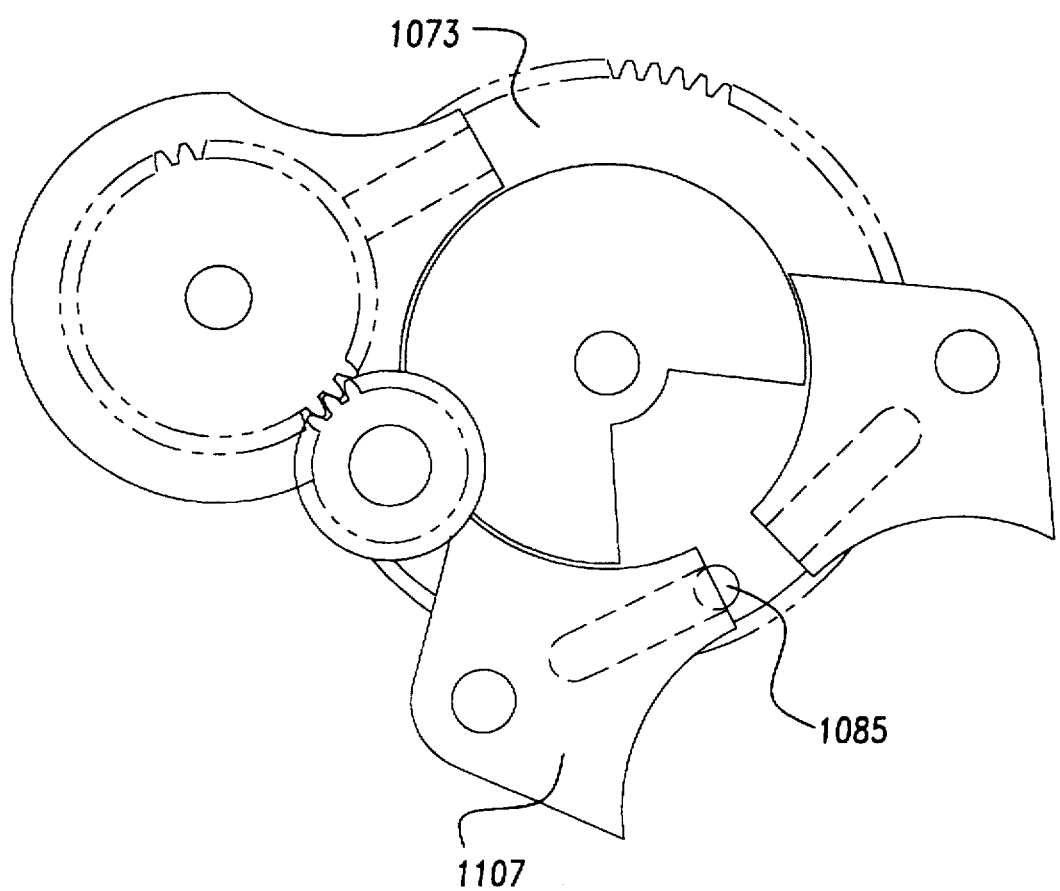
FIG. 10 is a diagrammatic rear view showing the power transmission assembly of the first preferred embodiment control system of the present invention at the beginning of a liftgate unlocking and release motion.
Figure 11:
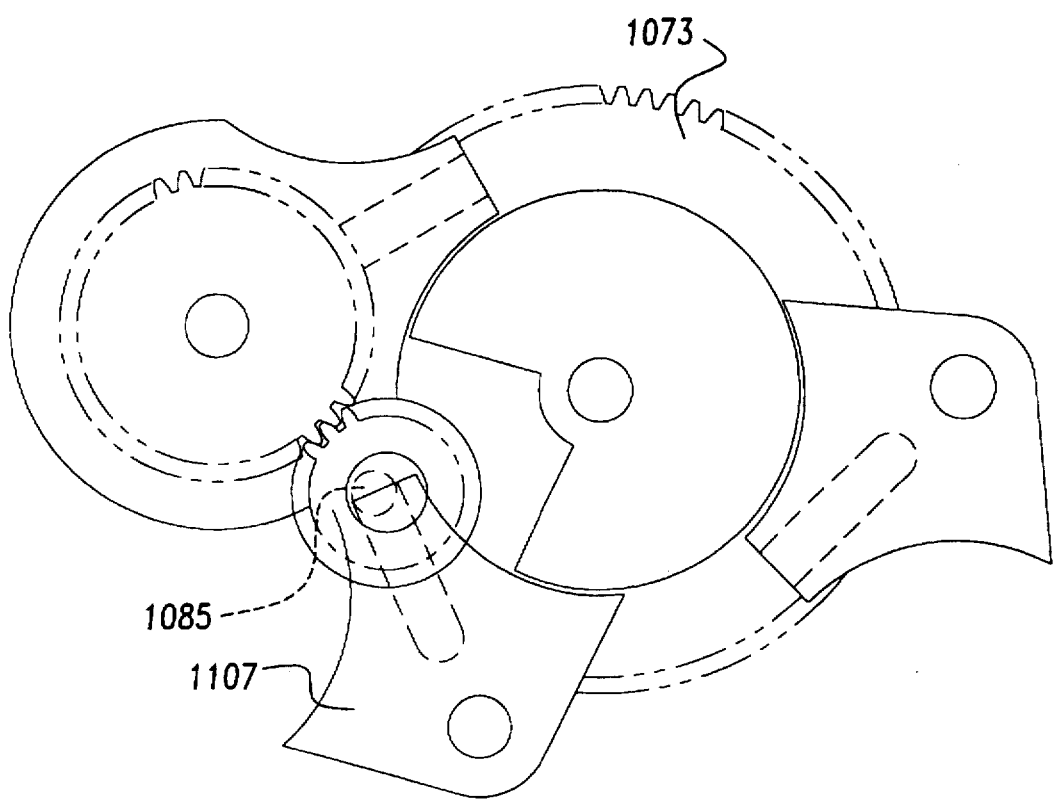
FIG. 11 is a diagrammatic rear view showing the power transmission assembly of the first preferred embodiment control system of the present invention at the completion of the liftgate unlocking and release motion.

In FIG. 10, helical gear 1073 and drive pin 1085 are shown rotated to the beginning of a liftgate window release positional range 1112 (see FIG. 12). In this position, drive pin 1085 engages cam 1107. Helical gear 1073, drive pin 1085 and cam 1107 are then rotated to the completion of the liftgate window release range 1112 (see FIG. 12) as is shown in FIG. 11. This causes the couplings and window release lock 47 (see FIG. 1) to move from a locked orientation to an unlocked orientation. After a pause, motor 1051 (see FIG. 2) is automatically reversed. Of course, it will be appreciated that the previously discussed positional ranges may have alternate patterns and arrangements, and may include additional or replacement functions.

Figure 13A:
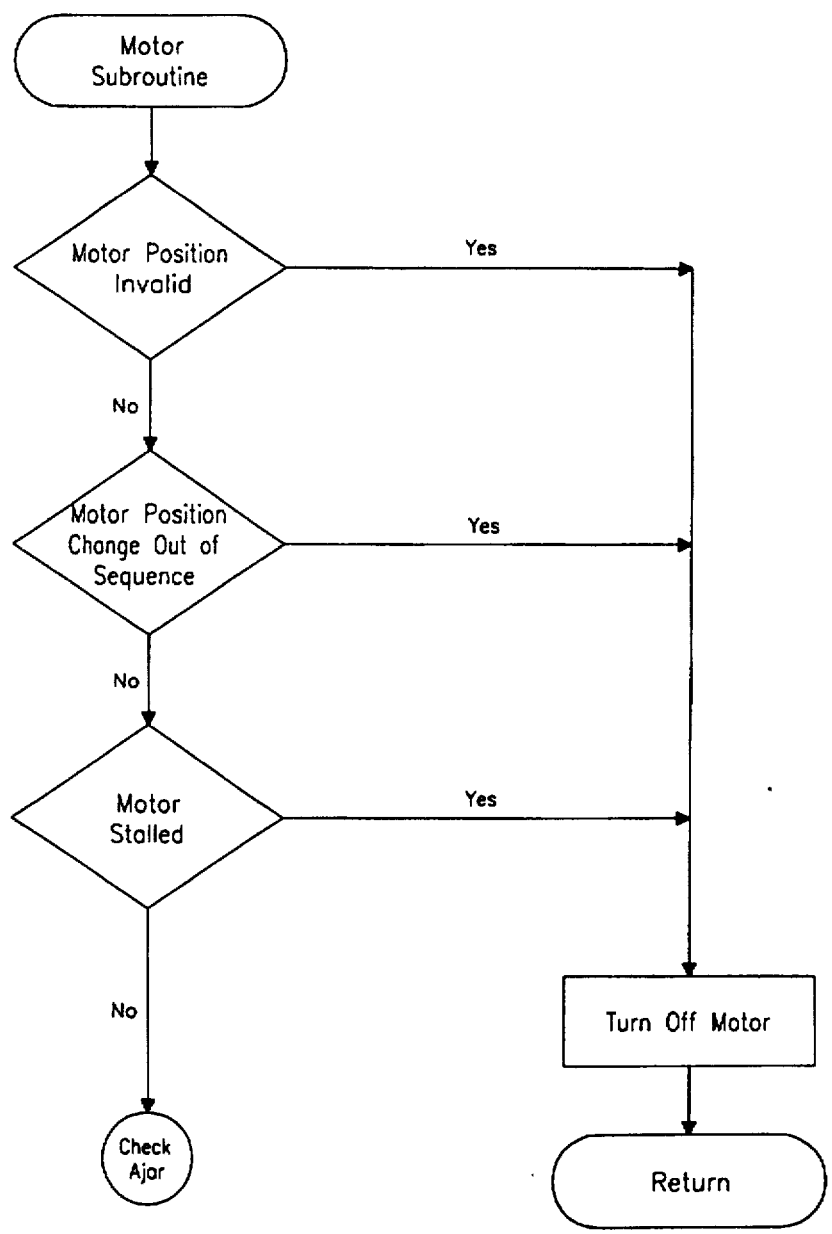
FIG. 13a is a cross sectional view showing a second preferred embodiment multi-functional apparatus employed in the preferred embodiment control system of the present invention.
Figure 13B:
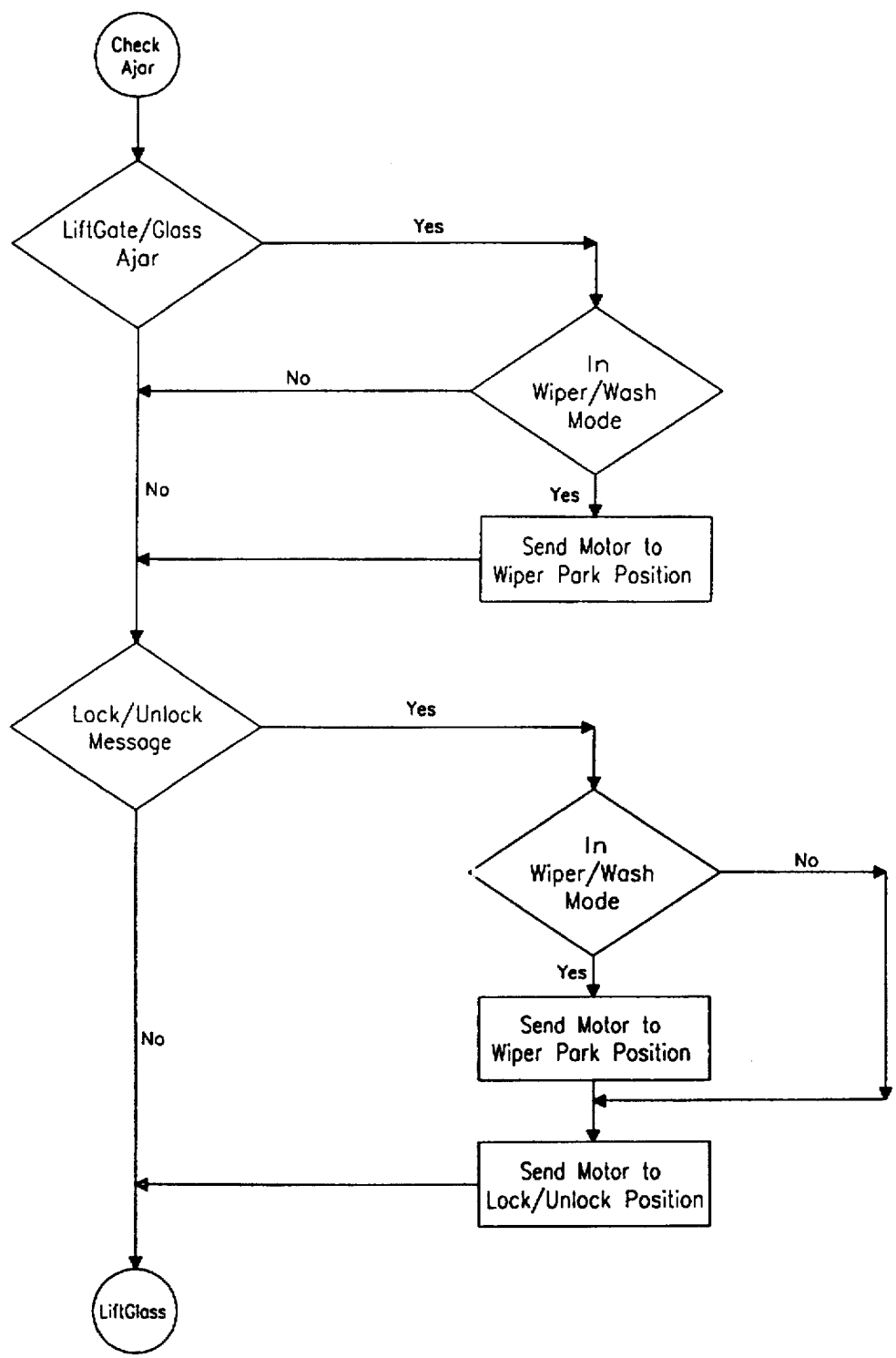
FIG. 13b is a perspective view, with portions broken away therefrom, showing the second preferred embodiment multi-functional apparatus employed in the preferred embodiment control system of the present invention.

A second preferred embodiment construction of central drive and power transmission unit 43 is illustrated in FIGS. 13a–b. A worm gear segment 155, also known as a rotatable member, of an armature shaft extends from an electromagnetic device such as an electric motor. A main helical gear 159 is enmeshed with worm gear segment 155. The electrically conductive feedback disk 1089 is retained to an inside face 183 of helical gear 159 through ultrasonically rolled welding or insert molding. Feedback disk 1089 is comprised of a set of copper alloy or brass alloy stamped contacts which are provided with differing conductive and nonconductive patterns depending on the specific positional ranges as is shown in FIG. 12. Returning to FIGS. 13a–b, a selectively disengagable clutch mechanism 185 is comprised of a spring biased actuator shaft 187, a stationary collar 189 extending from a gear housing, and a rear window wiper shaft 191. Actuator shaft 187 has a set of splines slidably enmeshed with internal splines of helical gear 159. Actuator shaft 187 further has a cam follower 193 which selectively rides along a camming surface 195. A pair of helical fingers 197 projecting from actuator shaft 187 are disengagably coupled within a pair of matching receptacles 199 of wiper shaft 191. A pivotable wire lock linkage assembly 201 and a linearly slidable window release lock linkage 203 are selectively movable upon rotated direct contact with a spring tab mounted upon a rear face of helical gear 159.

Figure 14A:
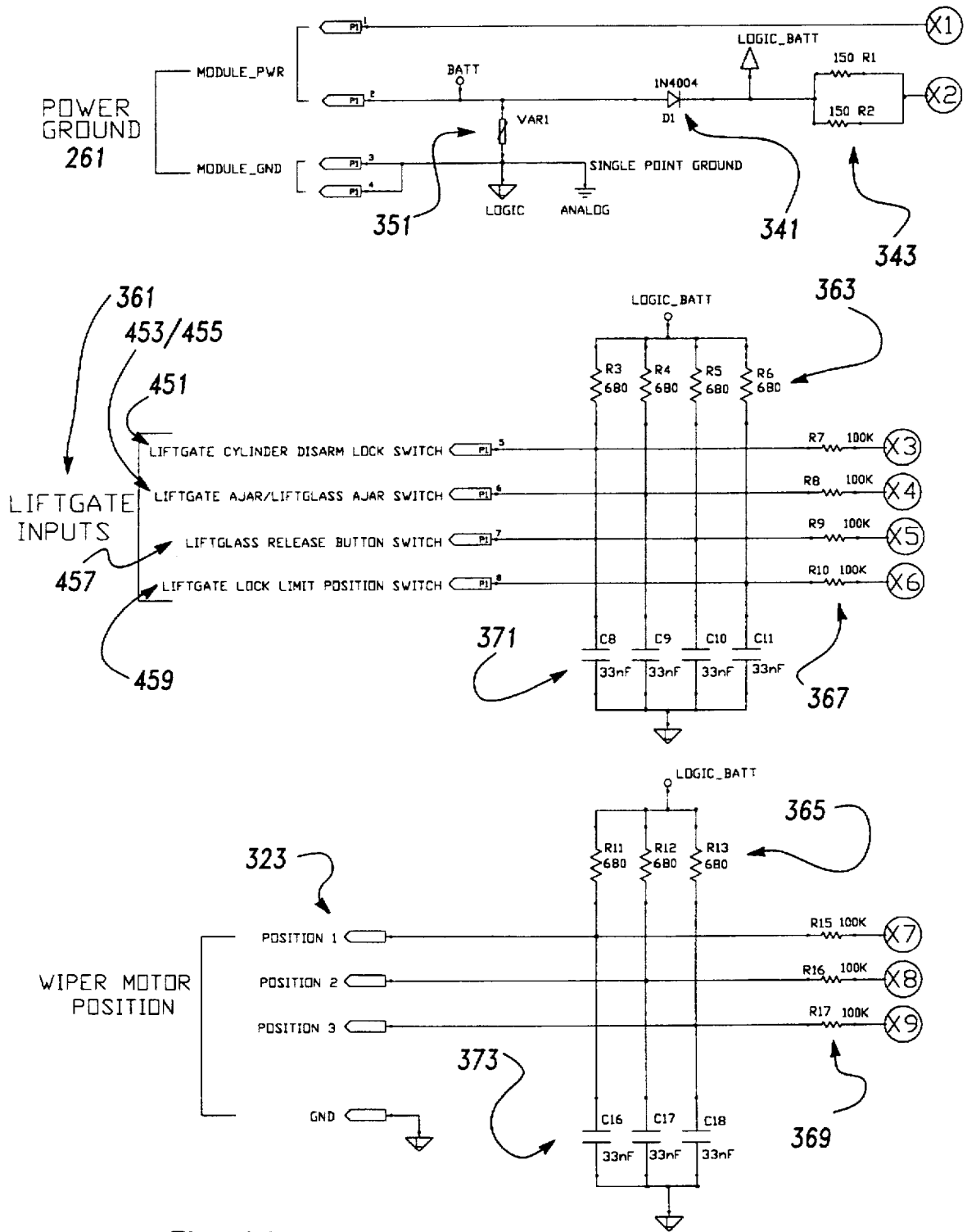
Figure 14B:
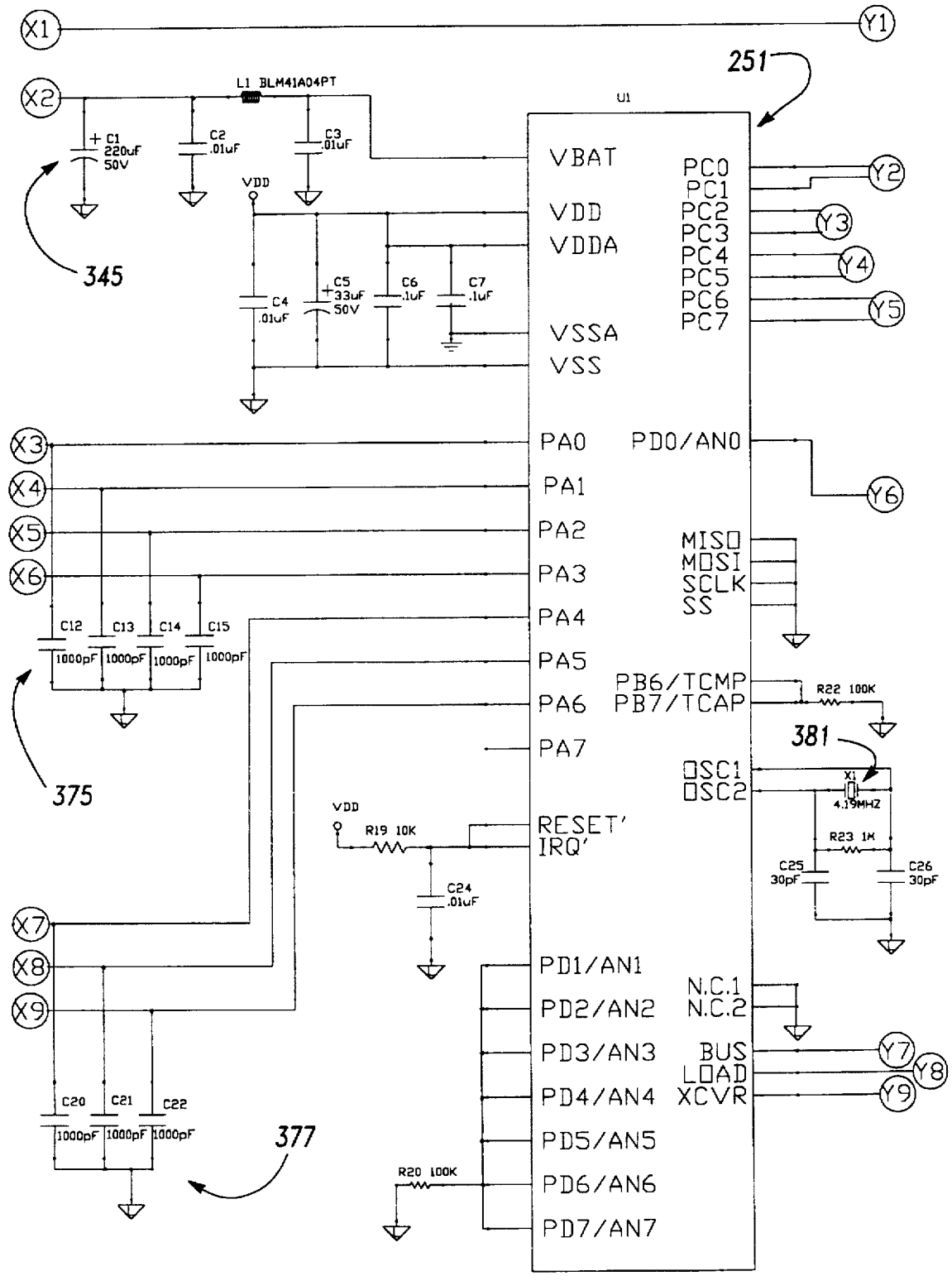
Figure 15:
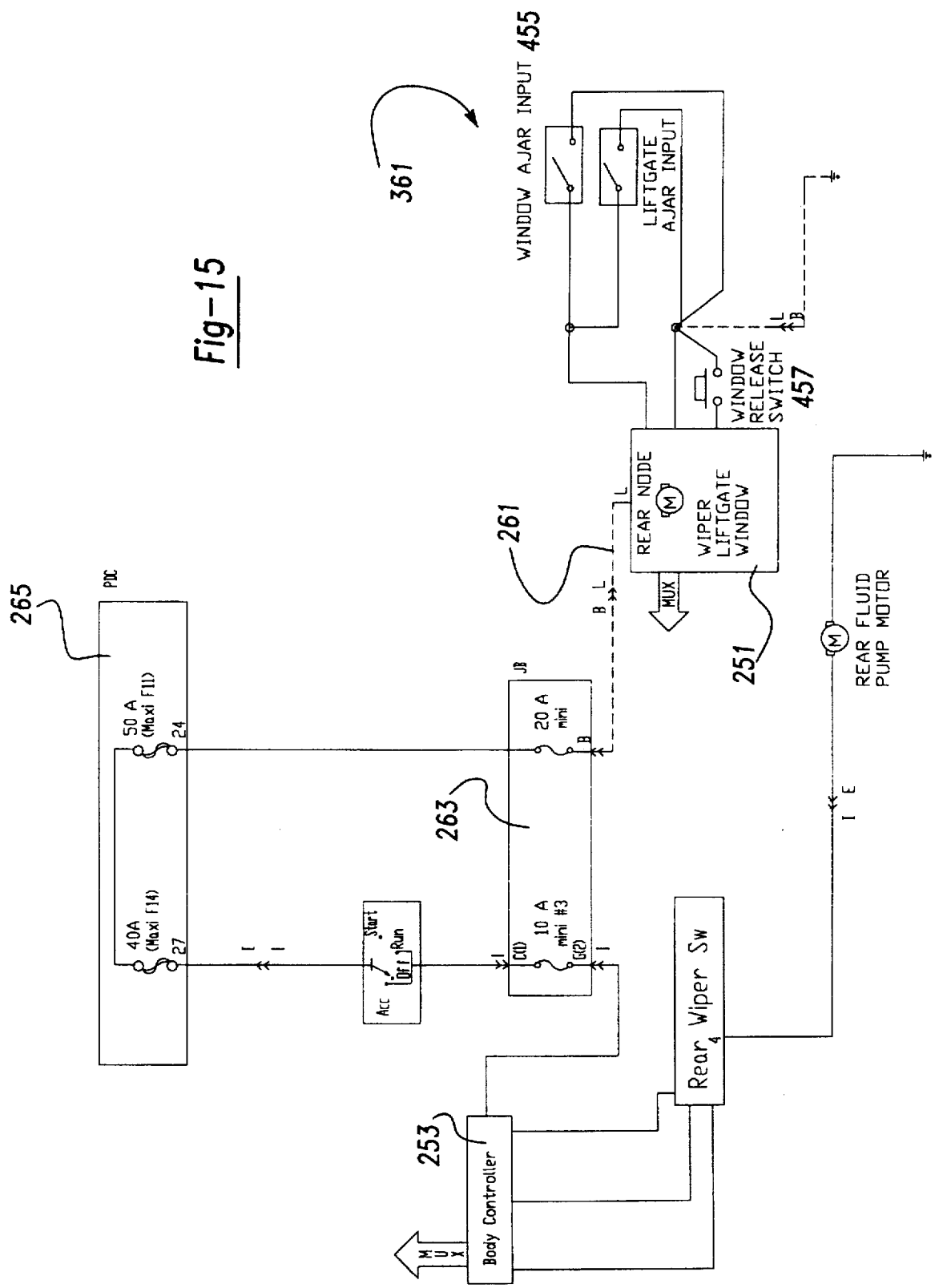
FIG. 15 is an electrical schematic diagram showing a portion of the automotive vehicle circuitry employing the preferred embodiment control system of the present invention.

Referring to FIGS. 1, 14 and 15, an electronic control unit or microprocessor 251 is mounted upon a rigid printed circuit board mounted to central drive and power transmission unit 43. Microprocessor 251 is operatively configured as a liftgate mounted rear node electrically connected to a main body controller or microprocessor 253 in a multiplexed manner through a wire harness 255. A well known SAE J1850 multiplex (MUX) protocol is used to communicate between rear node 251 and body controller 253. An SAE J2178 multiplex message strategy and an SAE J2190 multiplex diagnostic standards are also employed within rear node 251. These three SAE standards are incorporated by reference herewithin. Wire harness 255 contains four battery power/ground wire circuits 261, passing through a junction box (JB) 263 located within an instrument panel and a power distribution center (PDC) 265 located within an engine compartment, and one or two MUX communication wire circuits 267. One MUX circuit 267 is preferably used if rear node 251 is the last node within the electrical system as is the type employed in the present invention. Furthermore, only three power/ground circuits 261 may alternately be used depending on the specific electrical architecture desired. Throughout the circuit diagrams, ">>" is defined as a main harness electrical connector with "B" being defined as a body wiring harness, "L" being defined as a liftgate harness, "E" being defined as an engine compartment harness and "I" being defined as an instrument panel harness.

Figure 20A:
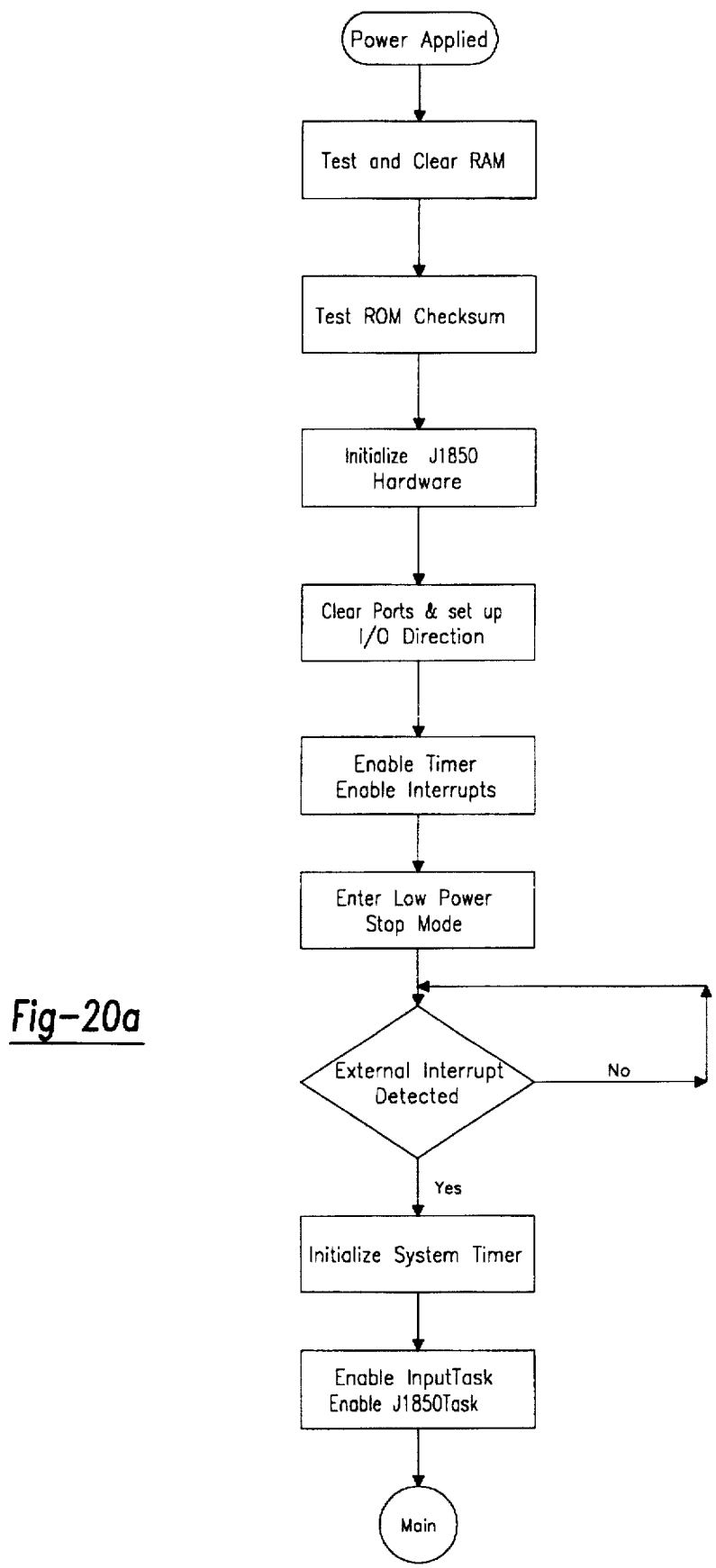
FIGS. 20a–b are flow diagrams showing a main microprocessor program employed with the preferred embodiment control system of the present invention.
Figure 20B:
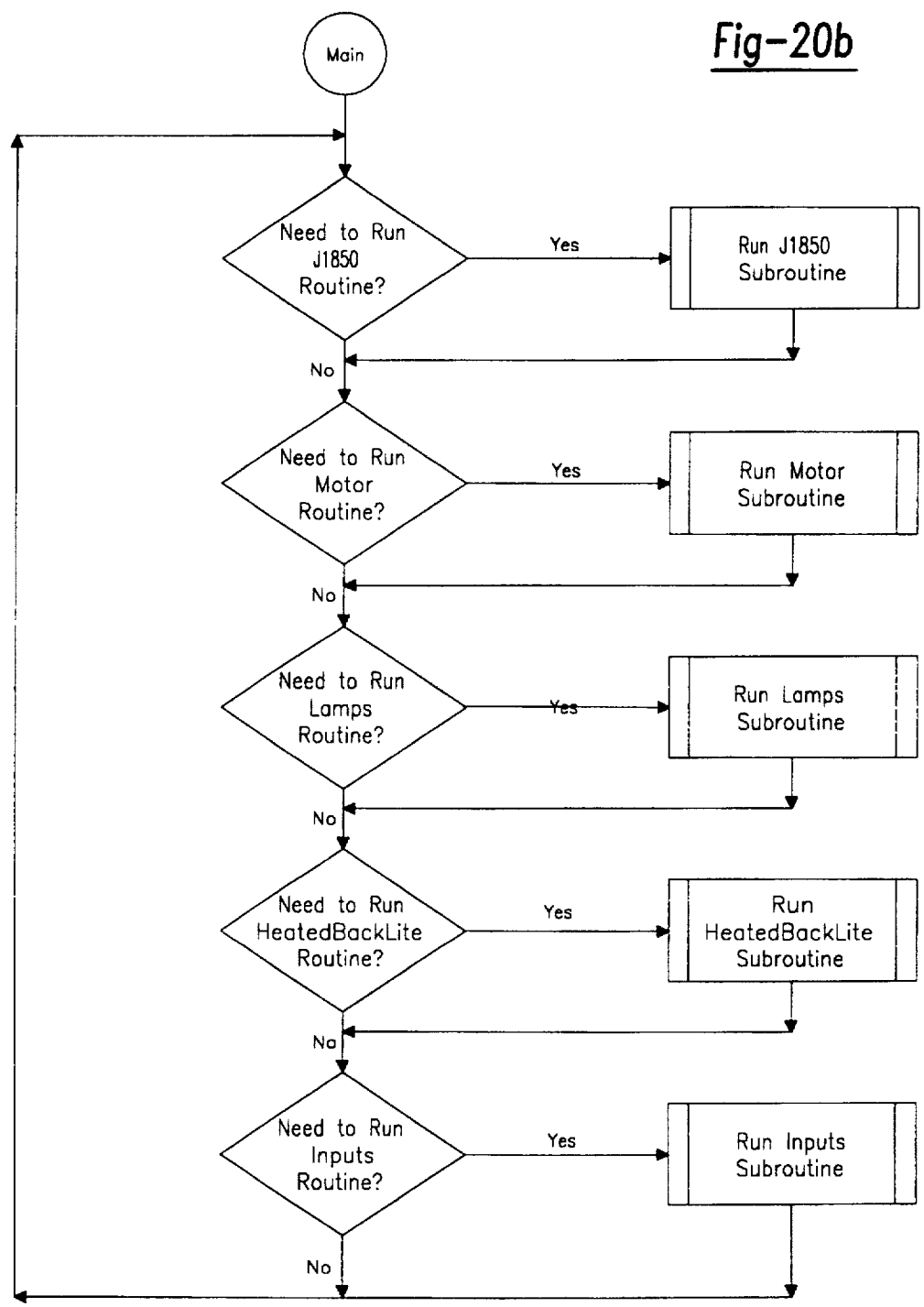

Microprocessor 251 measures the rotational position of helical gear 1073 (see FIG. 12), and in turn, the electrical motor, through feedback disk 1089 acting in conjunction with three electrical input contactors and a common ground contactor 323 riding therealong. By employing a monostropic code (i.e.: requiring only a single bit to change when the feedback disk passes from any positional range to an adjacent range) microprocessor 251 converts the feedback disk code pattern signal to a binary code for use within the motor subroutine as will be discussed in greater detail hereinafter. Circuit No. 1 of power/ground circuits 261 is a high current battery input to a normally closed relay 331. Microprocessor 251 controls relay 331 for supplying current to a conductive heated backlite element grid 333, made of known silver ceramic paste silkscreened upon backlite or rear window 33, through output buffers 335. The heated backlite portion of the control system is also shown in FIG. 20. Returning to FIGS. 1, 14 and 15, Circuit No. 2 of power/ground circuits 261 supplies current through a reverse battery protection diode 341, a parallel set of resistors 343, a battery filtering bank of capacitors 345 to the microprocessor 251 and output buffers 335. In addition, Circuit No. 2 supplies high current to a reversible H-bridge configuration, normally closed relay 346 for supplying current to the multi-functional motor via leads 347. Main body controller 253 sends a heated backlite energization signal to rear node 251 upon receiving an energization input from a heated backlite switch 399 actuable by the vehicle occupant.

Figure 16:
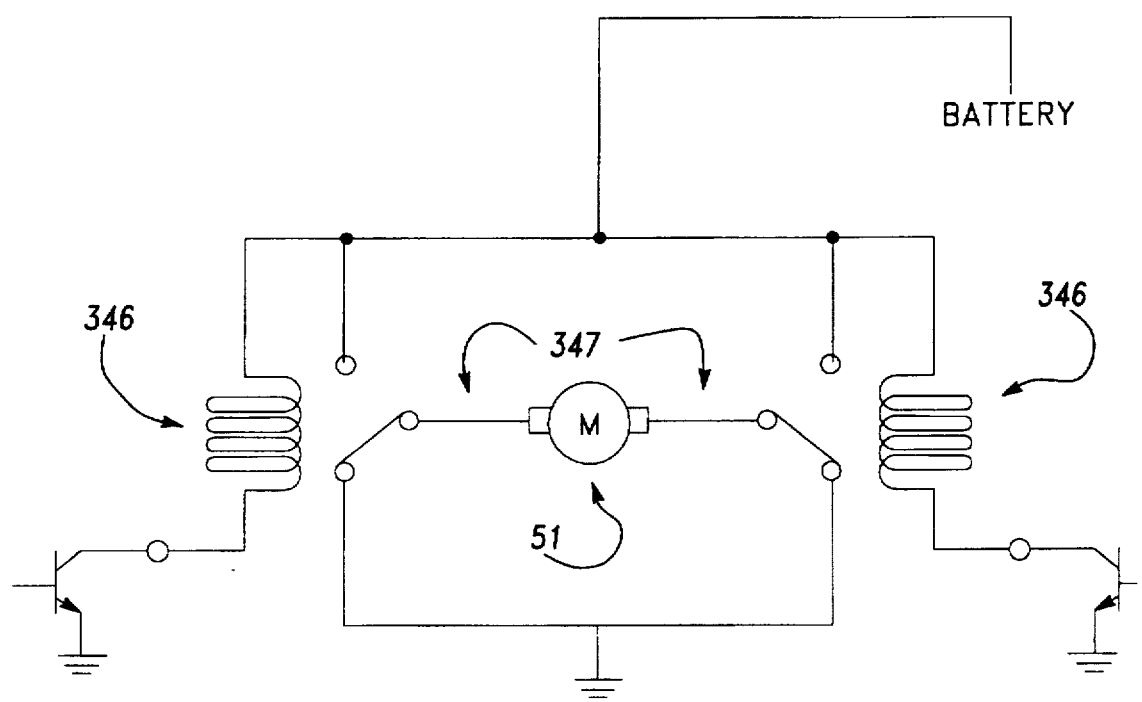
FIG. 16 is an electrical schematic diagram showing a motor portion of the preferred embodiment control system of the present invention.
Figure 17:
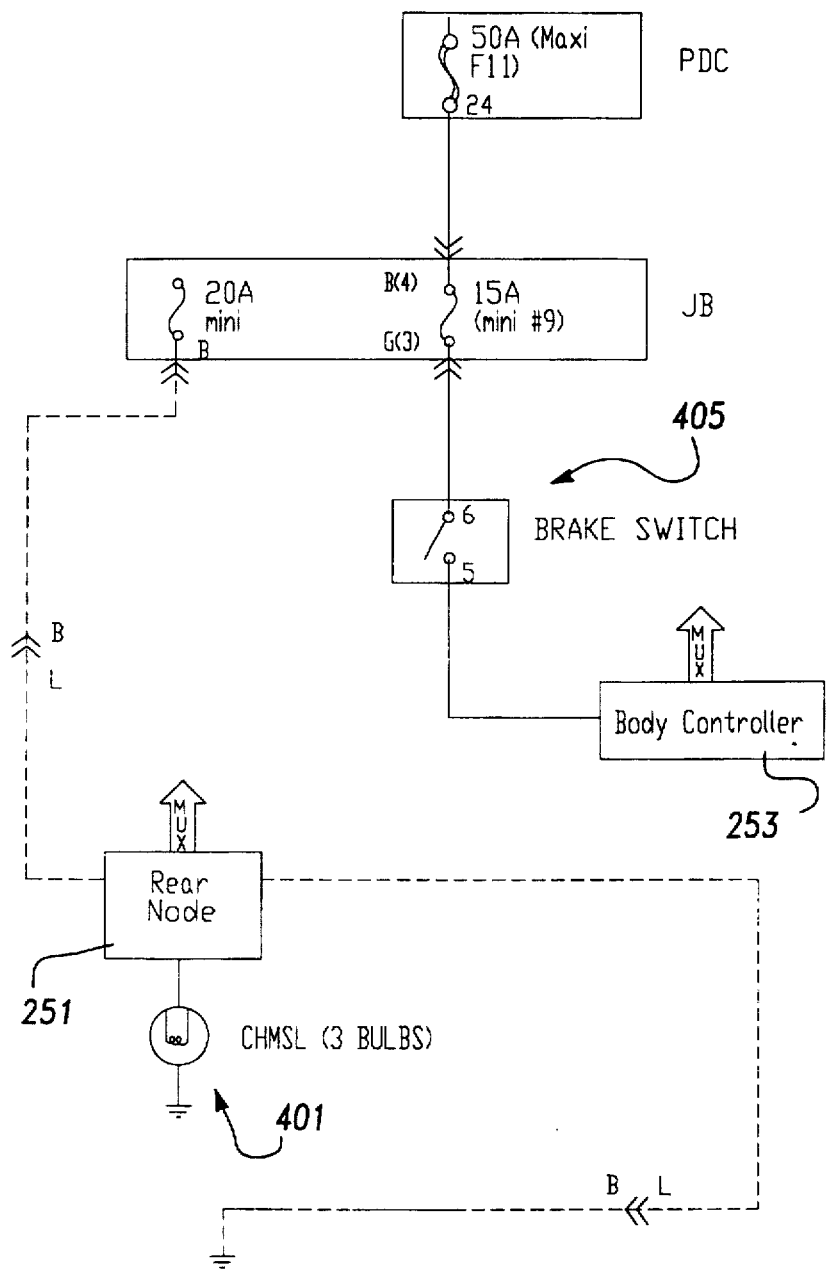
FIG. 17 is an electrical schematic diagram showing a center high mount stop lamp portion of the preferred embodiment control system of the present invention.

A load dump transient protection varistor 351 is provided between power Circuit No. 2 and the logic and analog ground circuits. The multi-functional motor portion of the present invention control system is also shown in FIG. 16. Returning again to FIGS. 1, 14 and 15, a set of liftgate mounted input switches 361 and wiper motor position inputs 323 operably provide input signals to microprocessor 251 subject to sets of pull up resistors 363 and 365, filtering sets of resistors 367 and 369, and filtering sets of capacitors 371, 373, 375 and 377. Liftgate inputs 361 include a liftgate key cylinder disarm switch 451, a liftgate ajar switch 453, rear window or liftglass ajar switch 455, liftglass/window unlock and release button switch 457, and a liftgate lock/limit position switch 459.

Microprocessor 251 preferably uses a Motorola MC68HCO5V6 (or alternately MC68HCO5V7) chip having an on-chip 5 volt power regulator, watchdog system, ROM, RAM and erasable EEPROM. A resonator clock 381 is also provided. The 68HCO5V7 Motorola specification, revision 1.0 of Aug. 12, 1994, is incorporated by reference here-within.

Referring to FIGS. 1, 14, 17 and 18, microprocessor 251 is selectively operable to control energization and illumination of center high mount stop lamp (CHMSL) bulbs 401 via circuits passing through a high side, solid state switch 403. CHMSL bulbs 401 are illuminated when rear node microprocessor 251 receives a multiplexed signal from body controller 253 in response to actuation of a brake pedal operated switch 405. In the figures, the dashed circuit represents a shared common circuit. Similarly, rear node microprocessor 251 selectively operates to energize and illuminate a license plate lamp having a pair of light bulbs 411, through switch 403 and the associated circuits. Main body controller 253 causes rear node microprocessor 251 to illuminate license lamp bulbs 411 in response to vehicle occupant actuation of a head lamp switch 421 in combination with energization of a park lamp relay 423 within junction box 263. A variety of interior and exterior reading, courtesy, brake, turn signal and other lamps may also be actuated through rear node microprocessor 251.

The MUX communication lines 267 are further provided with a set of resistors 391 for providing an integrity check, and a MUX bus loading and filtering inductive component 393. Microprocessor 251 further has means to debounce, or read and verify the stability of an input signal for a given time interval.

The operation and programmable software logic used to operate the preferred embodiment control system of the present invention will now be described in detail. The rear node microprocessor of the preferred embodiment control system of the present invention is operated by a main software program as shown in the flow diagrams of FIGS. 20a and b. When power is applied through the ignition switch, the rear node microprocessor first tests and clears the random access memory (RAM), tests the read only memory (ROM), performs a check sum function, initializes the J1850 hardware and clears the input and output ports while setting up the input and output direction. The rear node microprocessor then enables the timer and interrupts, enters a low power stop mode and then determines whether external interrupts are detected. If external interrupts are detected, the rear node microprocessor initializes the system timer, enables the input task and enables the J1850 task. The rear node microprocessor then determines if it needs to run the J1850 subroutine; if yes, the J1850 subroutine is run. If no, the rear node microprocessor then determines if it needs to run the electric motor subroutine; if yes, the electric motor subroutine is run. If no, the rear node microprocessor determines if it needs to run the lamps subroutine; if yes, the lamps subroutine is run. If no, the rear node microprocessor then determines if it needs to run the heated backlite subroutine; if yes, the heated backlite subroutine is run. If no, the rear node microprocessor determines if it needs to run the inputs subroutine; if yes, the rear node microprocessor runs the inputs subroutine. If no, or upon completion of the inputs subroutine, the rear node microprocessor returns to determining the need to run the J1850 subroutine.

Figure 21:
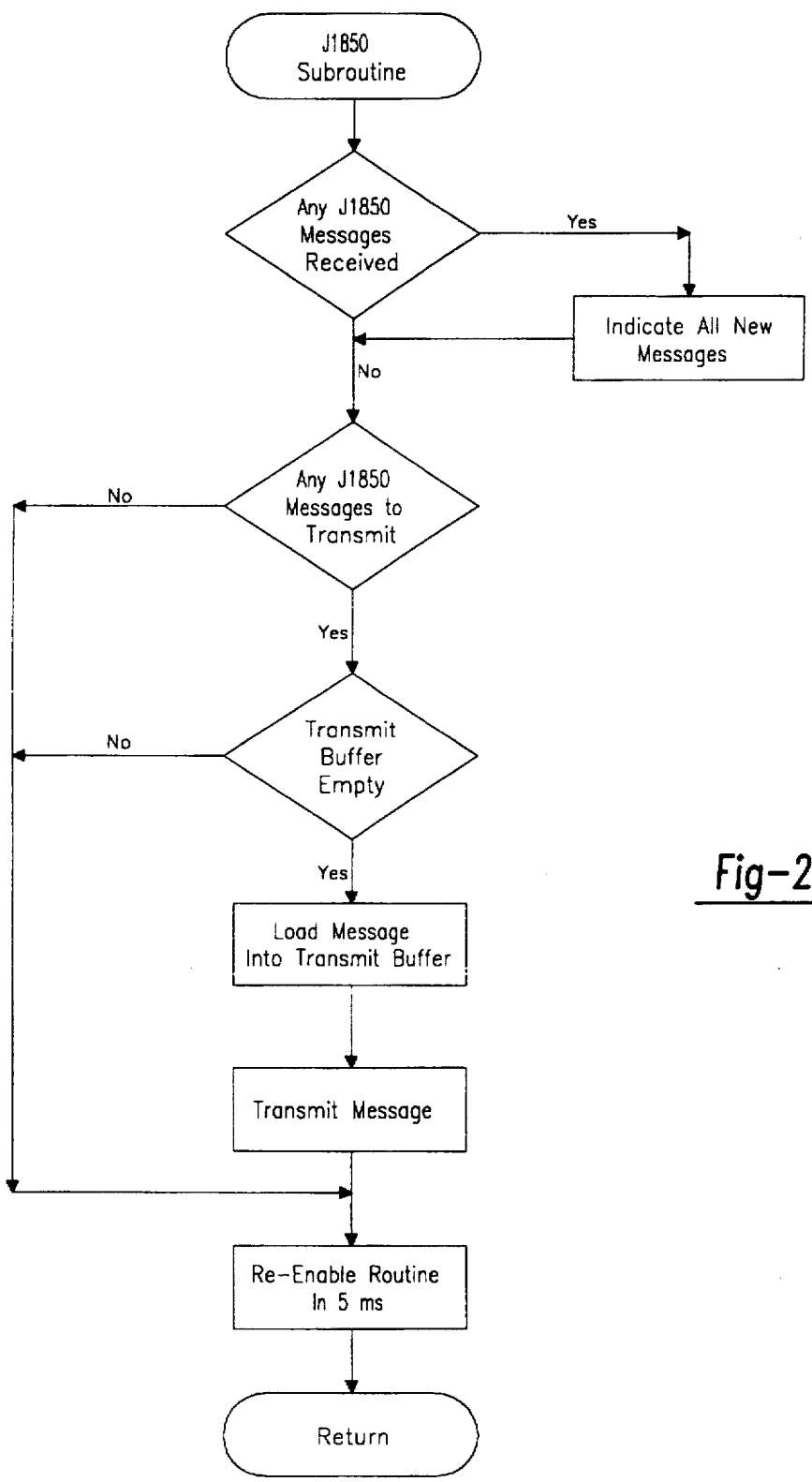
FIG. 21 is a flow diagram showing a J1850 software subroutine of the preferred embodiment control system of the present invention.

The logic flow of the J1850 subroutine is illustrated in FIG. 21. The rear node microprocessor must first determine if any J1850 messages are being received from the main body controller; if yes, the rear node microprocessor indicates and responds to all new messages. If no, or upon completion of the indicating and responding step, the rear node microprocessor must then determine if any J1850 messages are to be transmitted back to the main body controller; if no, the rear node microprocessor skips to a re-enable routine step. If yes, the rear node microprocessor must determine if the transmission buffer is empty; if no, the rear node microprocessor skips to the re-enable routine step. If yes, the rear node microprocessor loads the message to be transmitted into a transmission buffer and then transmits the message back to the main body controller through the J1850 circuits within the wire harness. Next, the rear node microprocessor re-enables the J1850 subroutine in five milliseconds. The rear node microprocessor software then returns to the main program.

Figure 22A:
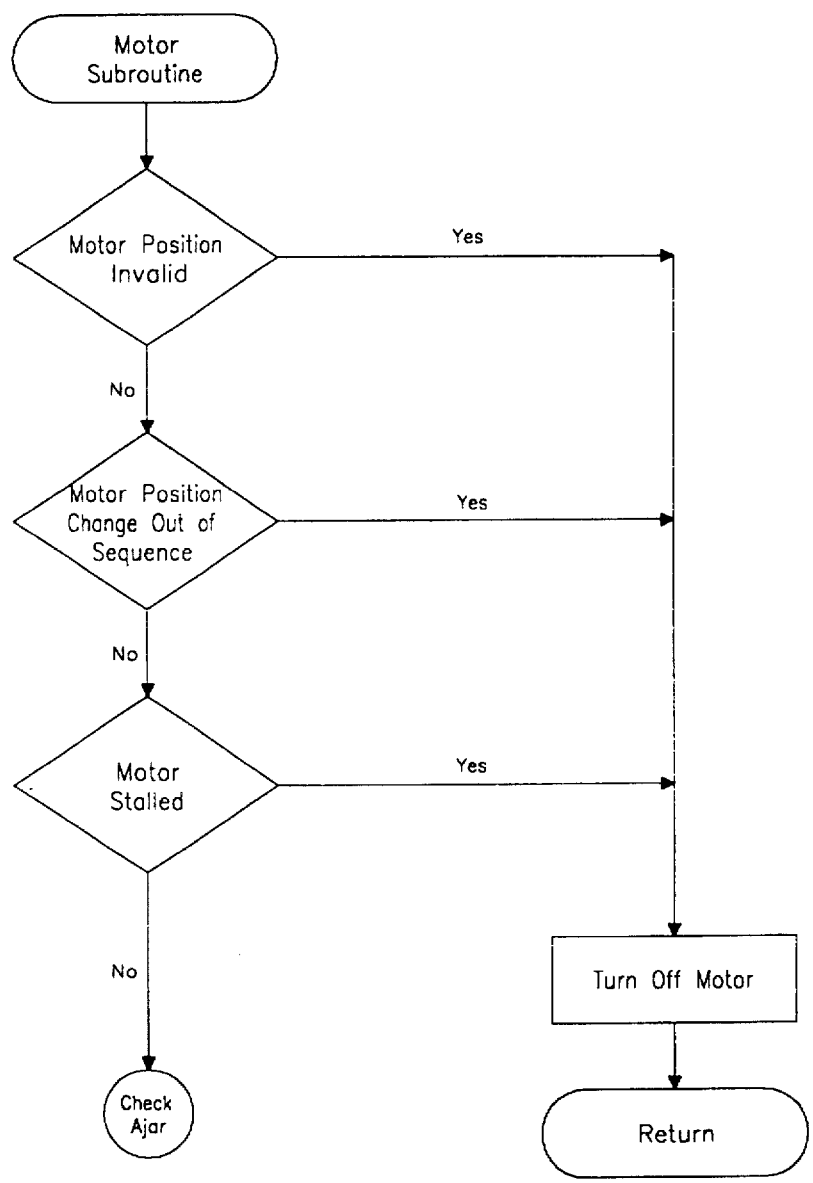
FIGS. 22a–c are flow diagrams showing a motor software subroutine of the preferred embodiment control system of the present invention.
Figure 22B:
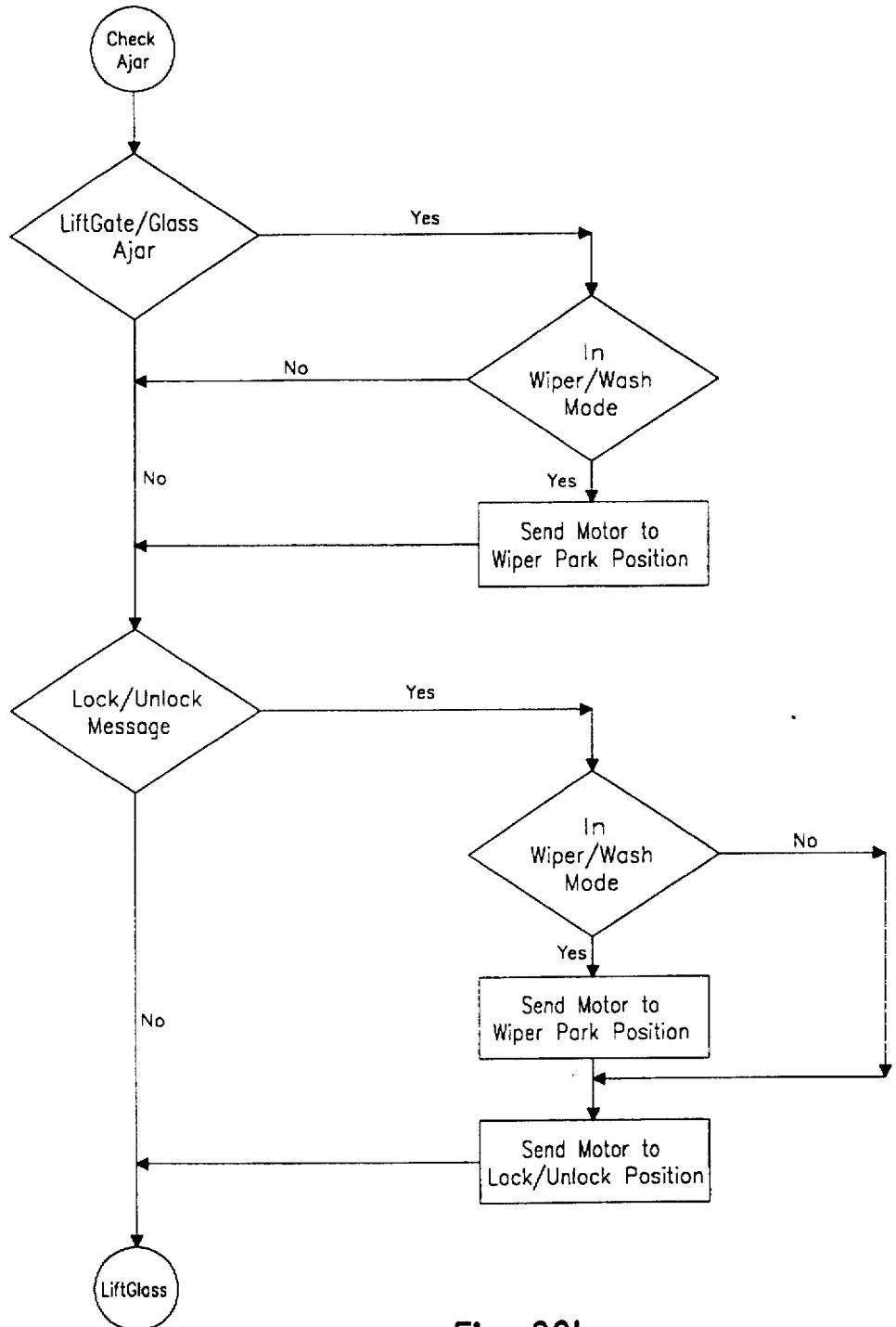
Figure 22C:
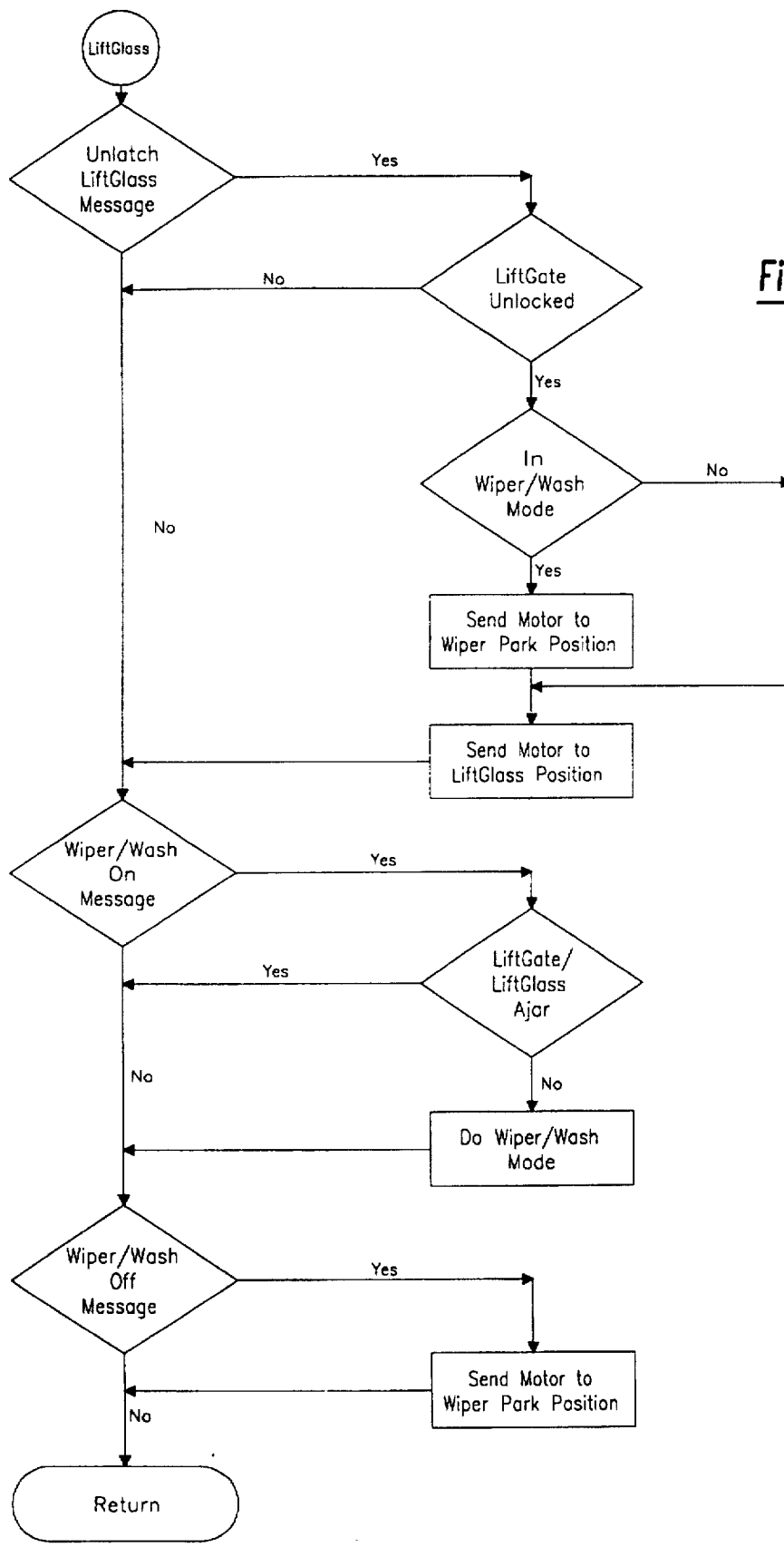

Referring to FIGS. 22a–c, the multi-functional electric motor subroutine is accessed by the rear node microprocessor. The rear node microprocessor must first determine if the motor position is invalid; if yes, the motor is turned off or de-energized and the software returns to the main program. If no, the rear node microprocessor must determine if the motor position change is out of operational sequence; if yes, the motor is turned off and the software returns to the main program. If no, the microprocessor must determine if the motor is in a stalled condition due to overheating, excessive loading due to ice build up, et cetera; if yes, the motor is turned off and the software returns to the main program. If no, the rear node microprocessor must determine if the liftgate or rear window are ajar or partially open; if yes, the rear node microprocessor determines if the motor is in the window wiper or window washing operational mode. If the motor is determined to be in the wiper/wash mode then the rear node microprocessor sends the motor to a wiper park position. Upon completion of sending the motor to the wiper park position if the ajar or wiper/wash mode decisions are no, then the rear node microprocessor must determine if it has received a liftgate lock or unlock actuation input message; if yes, the rear node microprocessor must determine if the electric motor is in the window wiper or window washing operational mode; if yes, the rear node microprocessor will send the motor to the wiper park position and subsequently send the motor to a rear window unlocking and release position. This allows the pneumatic cylinders to upwardly pivot the rear window without fear of interference of the window wiper assembly. If the microprocessor determines that the electric motor is not in the wiper/wash mode, then it skips directly to the step sending the motor to the liftglass unlocking position. The rear node microprocessor must then determine if it has then received a window wiper or window washing activation or on input message from the main body controller; if yes, it must then be determined if a liftgate or rear window ajar switch signal is being received (since the vehicle occupant could have manually closed, thereby locking, the rear window). If no ajar signal is being received, the rear node microprocessor causes the electric motor to oscillate the wiper assembly in a wiping or washing mode. If a wiper/wash on message has not been received, the liftgate or rear window ajar signal is being received, or upon completion of the wiper/wash mode, the rear node microprocessor must then determine if a wiper/wash off input message is being received from the main body controller; if yes, the rear node microprocessor sends the motor to the wiper park position. Upon completion of that step or upon determining no to the wiper/wash off message decision, the software returns to the main program.

Figure 23:
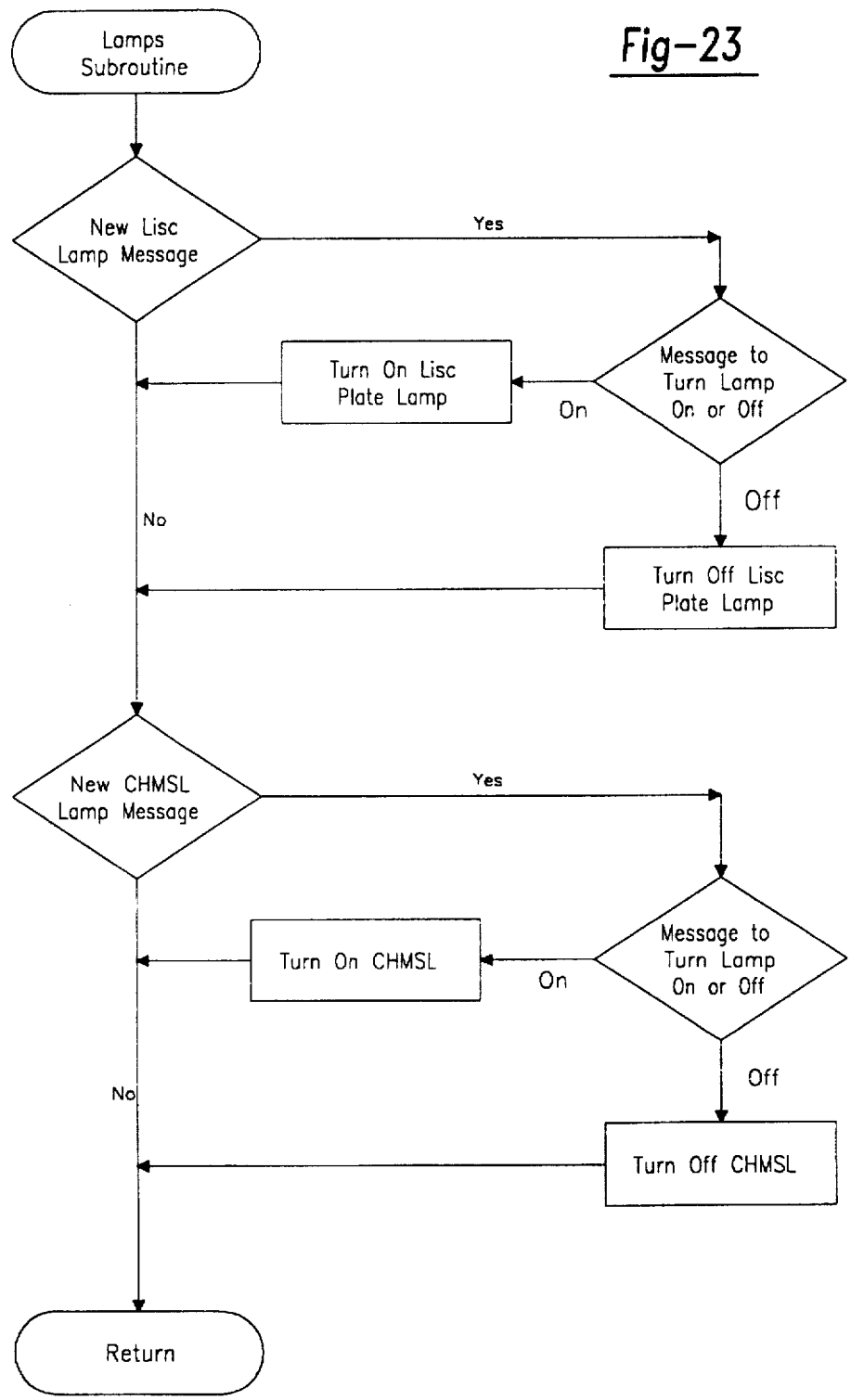
FIG. 23 is a flow diagram showing a lamps software subroutine of the preferred embodiment control system of the present invention.

As shown in FIG. 23, the lamps subroutine requires the rear node microprocessor to first determine whether a new license plate lamp input message has been received from the main body controller; if yes, it must then be determined if the message is to turn the lamp on or off. If an on message is present, the rear node microprocessor will cause the license plate lamp to be turned on or illuminated. If an off message is being received, the rear node microprocessor will cause the license plate lamp to be turned off or de-energized. Subsequently, the rear node microprocessor must determine if the CHMSL lamp message is being received from the main body controller; if yes, it must then be determined if the message is to turn the CHMSL lamp on or off. If an on message is being received, the rear node microprocessor will cause the CHMSL bulbs to become illuminated. If an off message is being received, the rear node microprocessor will cause the CHMSL bulbs to be turned off or de-energized. The software then returns to the main program.

Figure 24:
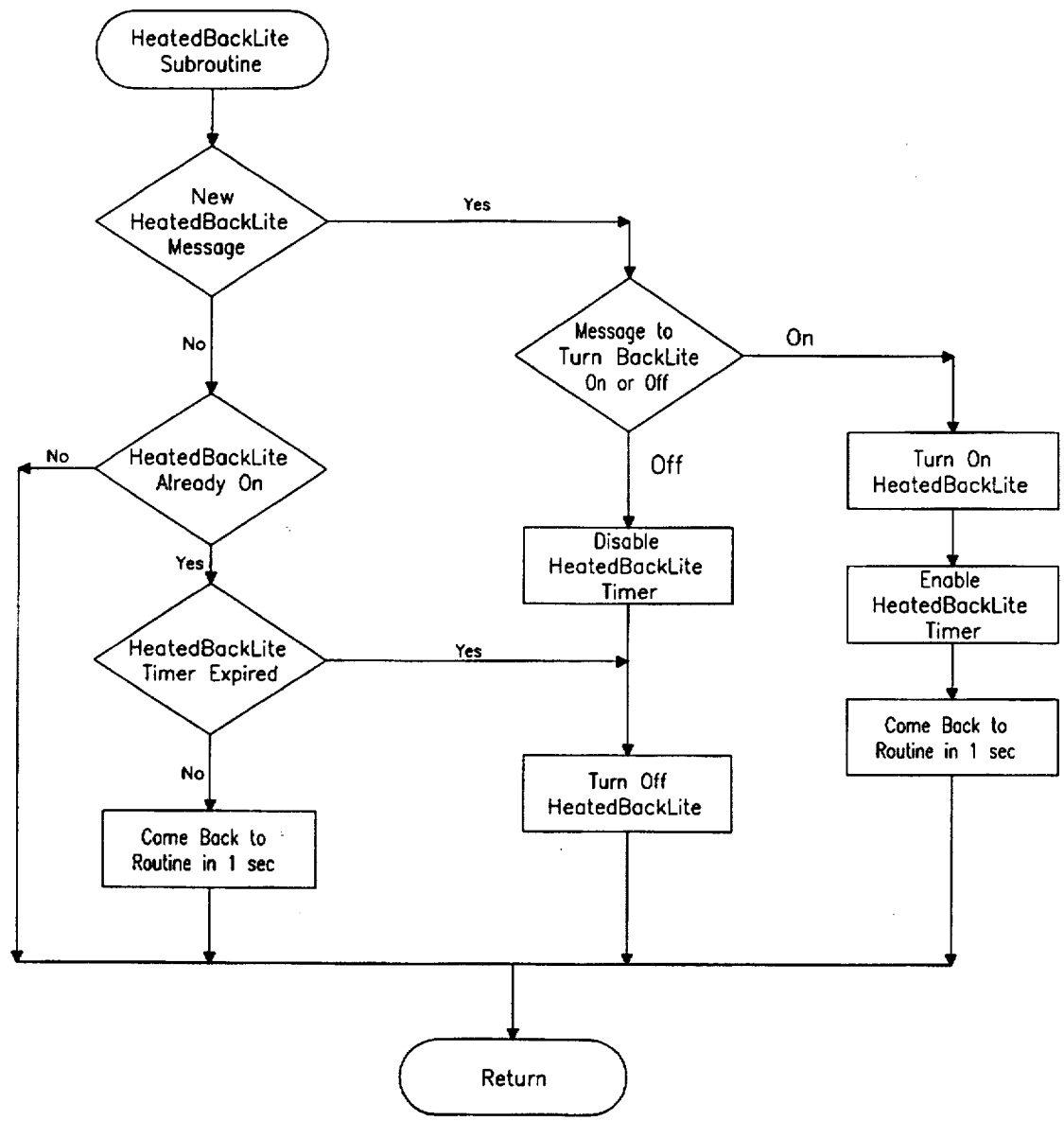
FIG. 24 is a flow diagram showing a heated backlite software subroutine of the preferred embodiment control system of the present invention.

The heated backlite subroutine is shown in FIG. 24. The rear node microprocessor must first determine if a new heated backlite operational message is being received from the main body controller; if yes, the rear node microprocessor must then determine if the message received is to turn the backlite heating elements on or off. If an on message is being received, the microprocessor causes the backlite heating elements to be energized, enables a heated backlite timer and then returns back to this subroutine in one second. If the message being received is to turn the heated backlite off then the rear node microprocessor disables the heated backlite timer and then turns off and causes de-energization of the heated backlite element. If a new heated backlite message is not being received then the rear node microprocessor must determine if the heated backlight elements are already on and energized; if yes, the microprocessor determines if the timer has expired. If the timer has expired then the rear node microprocessor turns off the heated backlight elements. If the heated backlite timer has not expired then the software returns to this subroutine in one second. Upon completion of all these branched steps, the software returns to the main program.

Figure 25A:
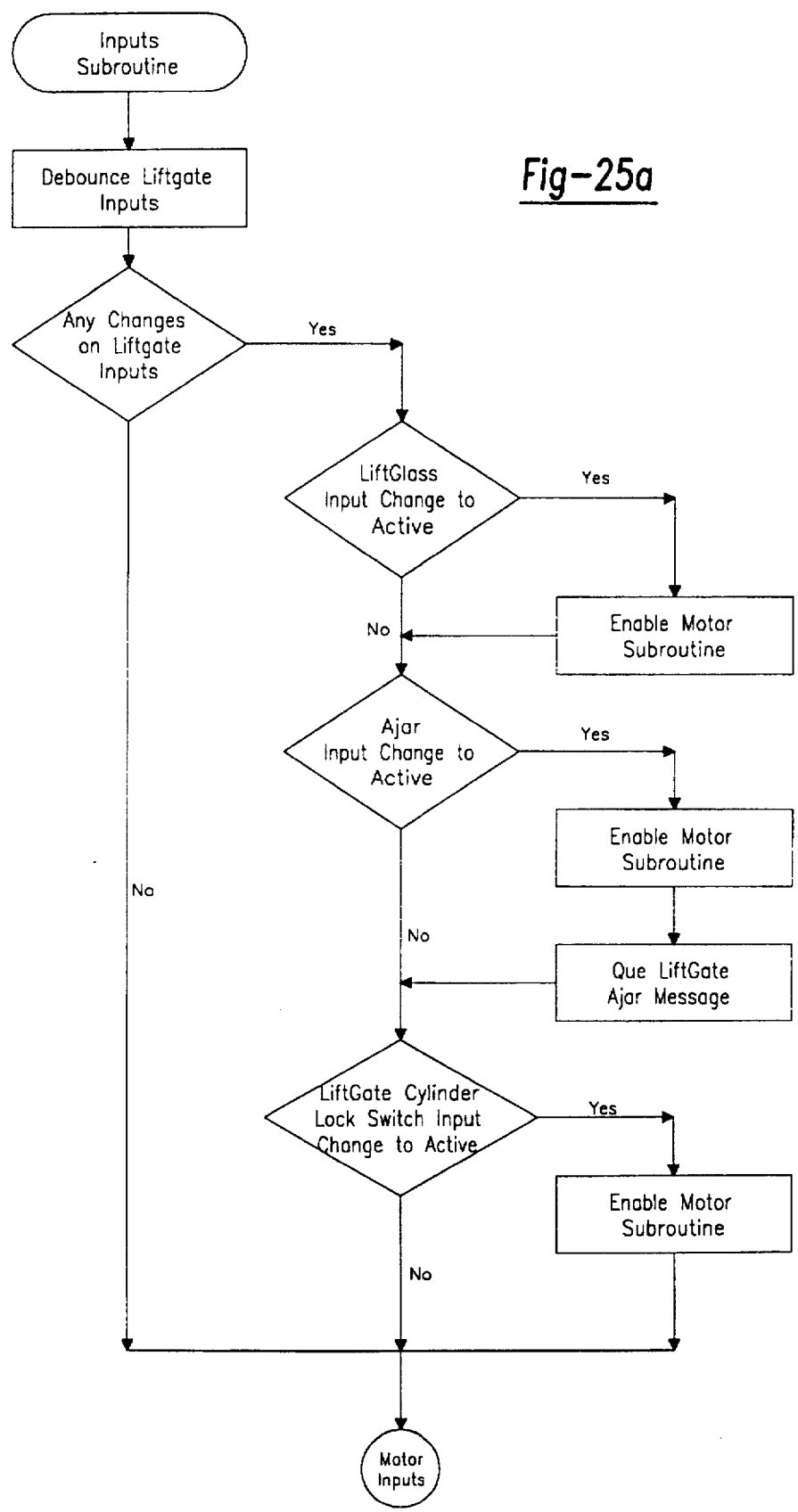
FIGS. 25a–c are flow diagrams showing an inputs software subroutine of the preferred embodiment control system of the present invention.
Figure 25B:
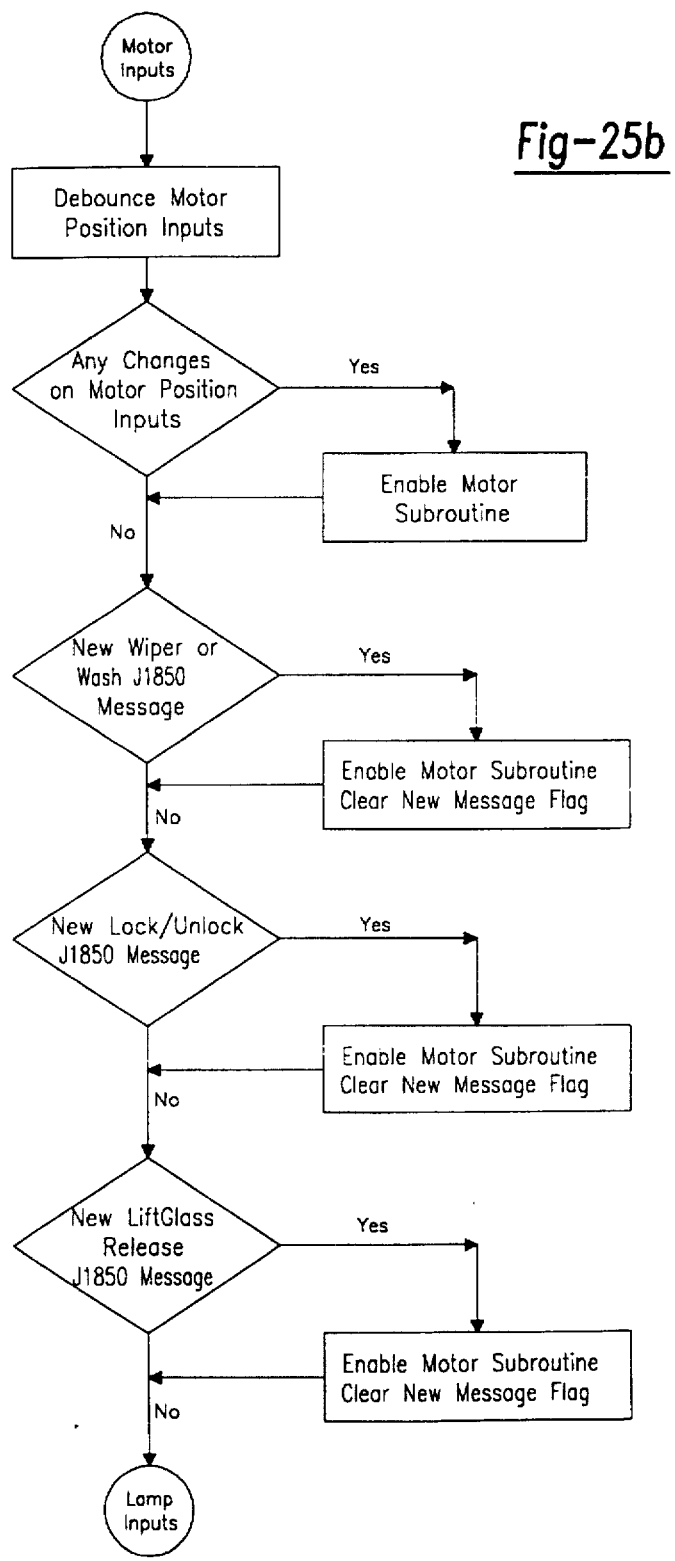
Figure 25C:
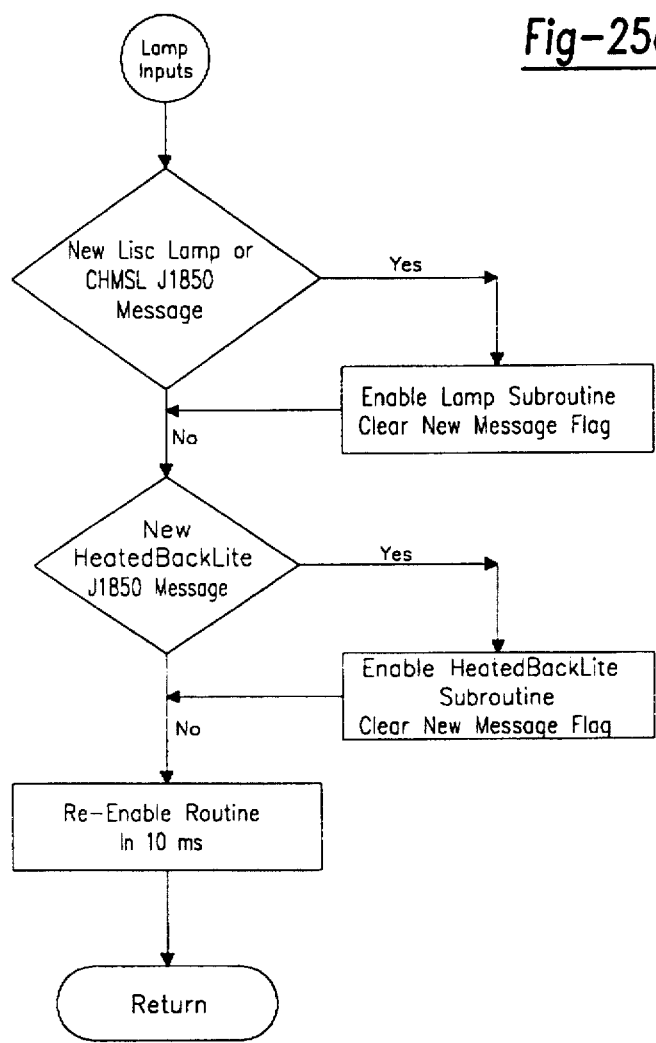

Finally, the inputs subroutine is shown in FIGS. 25a–c. The rear node microprocessor software first debounces the liftgate inputs and then must decide if any changes are present with regard to the liftgate inputs. If yes, the rear node microprocessor must determine if the liftgate input has changed to an active or signal generating state; if yes, the motor subroutine is enabled. If no, the rear node microprocessor must determine if the ajar input has changed to an active state; if yes, the motor subroutine is enabled and then the liftgate ajar input message is queued or accessed. The rear node microprocessor must next determine if the liftgate cylinder lock switch input has changed to an active state; if yes, the motor subroutine is enabled. A no determination for any of these previously discussed input decisions leads to a debouncing step for the motor position inputs. The rear node microprocessor determines if any changes regarding the motor position inputs are being received; if yes, the motor subroutine is enabled. The rear node microprocessor must then determine if a new wiper or wash J1850 message is being received; if yes, the motor subroutine is enabled and the software clears a new message flag. A new liftgate lock/unlock J1850 input message determination must be made; if yes, the motor subroutine is enabled and a new message flag is cleared. Subsequently, the rear node microprocessor decides if a new rear window unlock and release J1850 input message is being received; if yes, the motor subroutine is enabled and a new message flag is cleared. The rear node microprocessor must then determine if a new license lamp or CHMSL J1850 input message is being received; if yes, the lamp subroutine is enabled and a new message flag is cleared. Lastly, the rear node microprocessor then determines if a new heated backlite J1850 input message is being received; if yes, the heated backlite subroutine is enabled and a new message flag is cleared. This inputs subroutine is re-enabled in ten milliseconds and the software returns to the main program until the rear node microprocessor is de-energized.

While the preferred embodiment of this control system and multi-functional apparatus have been disclosed, it will be appreciated that various modifications may be made without departing from the present invention. It must be appreciated that in alternate embodiments, the feedback disk can be replaced or supplemented by other feedback means coupled to a gear or motor, such as optical sensors, magnetic sensors, limit switches, potentiometers, proximity sensors, rotation sensors, torque sensors, deposit metal traces, printed circuit boards, conductive ink traces, et cetera. FETs and bipolar components can further be used to replace the disclosed microprocessor. It will further be appreciated that a variety of other multiplexed or non-multiplexed, microprocessor or analog circuitry may be used to control the apparatus of the present invention. A solenoid, electromagnet or other electromagnetic devices may also be used in place of the previously described electric motor. Furthermore, additional spur gears, pinion gears, sector gears, planetary gears, jack screws, sprockets and chains, pulleys and belts, cables or other force transmitting means may be employed to couple between the electromagnetic device, rotatable member, clutch mechanism, intermittent motion mechanisms or locks. Moreover, a multiple gear transmission, linkage, belt or cable system can alternately couple a wiper assembly to the wiper shaft. The clutch mechanism can also be carried out in a variety of other constructions such as with Belleville springs, diaphragm springs, friction plates, sector gears, linkages or the like. The intermittent motion mechanisms may also be accomplished by employing other known intermittent motion mechanisms such as Geneva mechanisms, starwheel mechanisms, intermittent gearing, escapements, ratchet mechanisms or other known selectively actuable devices. The multi-functional apparatus of the present invention can further be employed for windshield wipers, side door locks or other automotive vehicle and non-automotive vehicle applications. While various materials, electronic components, software flow diagrams, circuits and force transmitting members have been disclosed, a variety of other such materials, electronic components, software flow diagrams, circuits and force transmitting devices may be used. It is intended by the following claims to cover these and any other departures from the disclosed embodiments which fall within the true spirit of this invention.

The invention claimed is:

1. An automotive vehicle control system for an automotive vehicle, said automotive vehicle control system comprising:

a rear window wiper shaft;

an electromagnetic device drivably coupled to said rear window wiper shaft;

an electronic control unit mounted at a rear door of the automotive vehicle and electrically connected to said electromagnetic device for selectively controlling energization thereof, said electronic control unit operable to function as a multiplexed rear node for the automotive vehicle, wherein upon energization of said electromagnetic device by said electronic control unit, said electronic control unit is operable to control a plurality of devices mounted at the rear door of the automotive vehicle;

a liftgate lock coupling; and a liftgate window release lock coupling;

said electromagnetic device is further defined as a single electric motor operable to selectively drive said wiper shaft and said lock couplings, said electromagnetic device and said electronic control unit mounted upon said rear liftgate.

2. The control system of claim 1 further comprising:

a rotatable member selectively driven by said electromagnetic device, said wiper shaft rotatable in response to selective rotation of said rotatable member; and feedback means for determining a rotated position of said rotatable member.

3. An automotive vehicle control system for an automotive vehicle having a rear door, said automotive vehicle control system comprising:

a rear window wiper shaft;

an electromagnetic device drivably coupled to said rear window wiper shaft;

an electronic control unit mounted on the rear door of the automotive vehicle, said electronic control unit being electrically connected to and selectively controlling energization of said eletromagnetic device, said electronic control unit being operable to function as a multiplexed rear node for the automotive vehicle;

a plurality of devices mounted on the rear door of the automotive vehicle being operably controlled by said electronic control unit;

a rotatable member selectively driven by said electromagnetic device, said wiper shaft being rotatable in response to selective rotation of said rotatable member; and feedback means for determining a rotated position of said rotatable member;

a first intermittent motion mechanism selectively engagable with said rotatable member.

4. The control system of claim 3 wherein said plurality of devices includes a liftgate lock coupling.

5. The control system of claim 3 wherein said plurality of devices includes a liftgate window release lock coupling.

6. The control system of claim 3 wherein said plurality of devices includes a stop lamp.

7. The control system of claim 3 wherein said plurality of devices includes a license lamp.

8. The control system of claim 3 wherein said plurality of devices includes an ajar switch.

9. The control system of claim 3 further comprising a main body microprocessor operably sending a multiplexed signal to said electronic control unit, said electronic control unit including a rear node microprocessor.

10. The control system of claim 3 further comprising:

means for selectively and drivably disengaging said wiper shaft from said rotatable member when said rotatable member drives said first intermittent motion mechanism; and said first intermittent motion mechanism being selectively and drivably disengaged from said rotatable member when said rotatable member drives said wiper shaft.

11. The control system of claim 10 further comprising:

a second intermittent motion mechanism selectively engagable with said rotatable member;

means for selectively and drivably disengaging said wiper shaft from said rotatable member when said rotatable member drives said second intermittent motion mechanism; and said second intermittent motion mechanism being selectively and drivably disengaged from said rotatable member when said rotatable member drives said wiper shaft and when said rotatable member drives said first intermittent motion mechanism.

12. The control system of claim 3 wherein said means for determining a rotated position of said rotatable member includes:

a feedback conductive pattern movable in conjunction with said rotatable member;

at least three conductive contactors electrically interfacing with said feedback conductive pattern; and electrical circuit means for electrically connecting said electronic control unit to said conductive contactors, at least two of said conductive contactors operable for providing an input signal to said electronic control unit.

13. The control system of claim 3 wherein said electronic control unit is further defined as a microprocessor directly mounted to said electromagnetic device.

14. An automotive vehicle control system for an automotive vehicle having a rear door, said automotive vehicle control system comprising:

a rear window wiper shaft;

an electromagnetic device drivably coupled to said rear window wiper shaft;

an electronic control unit mounted on the rear door of the automotive vehicle, said electronic control unit being electrically connected to and selectively controlling energization of said electromagnetic device, said electronic control unit being operable to function as a multiplexed rear node for the automotive vehicle;

a plurality of devices mounted on the rear door of the automotive vehicle being operably controlled by said electronic control unit;

a main gear rotatably driven by said electromagnetic device, said electromagnetic device being further defined to include a fractional horsepower electric motor;

mechanical means for disengagably coupling said wiper shaft from said main gear; and circuit means for selectively reversing energization to said electric motor.

15. The control system of claim 14 further comprising:

said electronic control unit employing first software logic means for causing said electric motor to rotate said main gear in a cyclical manner within a window wiping positional range; and said electronic control unit further employing second software logic means for causing said electric motor to rotate said main gear to a depressed wiper arm parking position.

16. The control system of claim 15 further comprising said electronic control unit employing third software logic means for causing said electric motor to rotate said main gear within a first lock positional range.

17. The control system of claim 16 further comprising said electronic control unit employing fourth software logic means for causing said electric motor to rotate said main gear within a second lock positional range.

18. The control system of claim 14 further comprising:
a liftgate lock coupling; and
a liftgate window release lock coupling;
said electromagnetic device being further defined as a single electric motor operable to selectively drive said wiper shaft and said lock couplings, said electromagnetic device and said electronic control unit being mounted upon said rear door.

19. An automotive vehicle control system comprising:
an electronic control unit;
a fractional horsepower electric motor electrically connected to said electronic control unit, said motor further including a rotatable armature shaft; and
said electronic control unit selectively energizing said motor to cause said armature shaft to move a first amount of rotations for actuating a first device coupled thereto, said electronic control unit selectively energizing said motor to move said armature shaft a second amount of rotations for actuating a second device coupled thereto.

20. The control system of claim 19 wherein said electronic control unit selectively energizes said motor to cause said armature shaft to move to a third amount of rotations for actuating a third device coupled thereto.

21. The control system of claim 20 wherein said third device is a lock coupling.

22. The control system of claim 19 further comprising multiplexing means for allowing electrical communications to said electronic control unit.

23. The control system of claim 22 further comprising a main body microprocessor operable for receiving input signals from vehicle occupant-controlled switches, said main body microprocessor electrically communicating with said electronic control unit through said multiplexing means.

24. The control system of claim 19 wherein said electronic control unit and said motor are mounted upon a rear door of said automotive vehicle, said rear door movable to access a passenger compartment of said automotive vehicle.

25. The control system of claim 19 further comprising:
first intermittent motion means coupling said first device to said armature shaft; and
second intermittent motion means coupling said second device to said armature shaft.

26. The control system of claim 19 wherein said first device includes a rear window wiper shaft.

27. The control system of claim 19 further comprising relay means for electrically connecting said electronic control unit and said motor, said relay means operable for selectively reversing electrical polarity to said motor in response to an output signal from said electronic control unit.

28. An automotive vehicle control system comprising:
a fractional horsepower, dc, electric motor;
a main gear rotatably driven by said electric motor;
circuit means for selectively reversing energization to said electric motor;
an electronic control unit employing first software logic means for causing said electric motor to rotate said main gear in a cyclical manner within a window wiping positional range;
said electronic control unit further employing second software logic means for causing said electric motor to rotate said main gear to a depressed wiper arm parking position; and
said electronic control unit employing third software logic means for causing said electric motor to rotate said main gear within a first lock positional range.

29. The control system of claim 28 further comprising said electronic control unit employing fourth software logic means for causing said electric motor to rotate said main gear within a second lock positional range.

30. The control system of claim 28 further comprising a main body microprocessor operable for receiving input signals from vehicle occupant-controlled switches, said main body microprocessor electrically communicating with said electronic control unit through multiplexing means.

31. A method of controlling at least one automotive vehicle device, said method comprising the steps of:
(a) receiving a first multiplexed signal by a rear node electronic control unit from a main body electronic control unit;
(b) energizing an electric motor;
(c) rotating a rear window wiper shaft by said motor;
(d) receiving a second multiplexed signal by said rear node electronic control unit from said main body electronic control unit; and
(e) energizing an illumination device in response to step (d).

32. A method of controlling at least one automotive vehicle device, said method comprising the steps of:
(a) receiving a first multiplexed signal by a rear node electronic control unit from a main body electronic control unit;
(b) energizing an electric motor;
(c) rotating a rear window wiper shaft by said motor; and
(d) determining if an ajar input signal is being received by said rear node electronic control unit.

33. The method of claim 32 further comprising the steps of:
(a) receiving a second multiplexed signal by said rear node electronic control unit from said main body electronic control unit; and
(b) energizing an illumination device in response to step (a).

34. The method of claim 33 further comprising the step of illuminating a center high mount stop lamp employing said illumination device.

35. The method of claim 33 further comprising the step of illuminating a license lamp employing said illumination device.

36. The method of claim 32 further comprising the step of rotating said wiper shaft to a park position if said determining if an ajar input signal is being received step is answered affirmatively.

37. A method of controlling at least one automotive vehicle device, said method comprising the steps of:
(a) receiving a first multiplexed signal by a rear node electronic control unit from a main body electronic control unit;

(b) energizing an electric motor;

(c) rotating a rear window wiper shaft by said motor; and (d) receiving a second multiplexed signal by said rear node electronic control unit from said main body electronic control unit;

(e) energizing said motor in response to step (d); and (f) moving a lock coupling in response to step (e) but not in response to said receiving a first multiplexed signal step.

38. A method of operating an automotive vehicle control system employing a microprocessor, the method comprising the steps of:

(a) checking for a liftgate ajar signal from a first switch indicating that a liftgate is ajar;

(b) checking for a liftgate window ajar signal from a second switch indicating that a liftgate window is ajar;

(c) allowing for energization of a fractional horsepower electric motor if either of said steps of (a) and (b) detect said ajar signals;

(d) moving a portion of said motor to a window wiper park position in response to step (c);

(e) checking for a lock movement input signal from a switch indicating that movement of a lock is desired;

(f) allowing for energization of said motor if said checking step of (e) detects said lock movement input signal; and (g) moving said portion of said motor to a lock movement position in response to step (f).

39. The method of claim 38 further comprising the step of allowing for energization of an illumination source by said microprocessor.

40. A method of operating an automotive vehicle control system comprising the steps of:

(a) determining if a lock movement input signal has been received;

(b) energizing an electric motor if said determining step of (a) detects said lock movement input signal;

(c) unlocking a lock mechanism in response to step (b);

(d) determining if a window wiper actuation input signal has been received;

(e) energizing said motor if said determining step of (d) detects said wiper actuation input signal; and (f) moving a window wiper shaft throughout a wiping positional range in response to step (e).

41. The method of claim 40 further comprising the steps of:

(a) sensing a rotational position of a rotatable portion of said motor;

(b) deenergizing said motor upon sensing that said rotatable portion of said motor is disposed in a desired position.

42. The method of claim 40 further comprising the sequential steps of:

(a) detecting that said wiper actuation input signal is no longer present; and (b) rotating a rotatable portion of said motor to a wiper park position.

43. The method of claim 40 further comprising the steps of:

(a) determining if a lamp illumination input signal is present for indicating that illumination of a lamp is desired; and (b) energizing an illumination source within said lamp if said determining step of (a) detects said lamp input signal.

44. The method of claim 40 further comprising the steps of:

(a) determining if a heated backlite activation input signal is present for indicating that activation of heated backlight conductive elements are desired; and (b) energizing said heated backlite conductive elements if said determining step of (a) detects said heated backlite input signal.

* * * * *